(12) United States Patent
Nakamura et al.

(10) Patent No.: US 11,342,812 B2
(45) Date of Patent: May 24, 2022

(54) MOTOR

(71) Applicant: NIDEC CORPORATION, Kyoto (JP)

(72) Inventors: Yoshinobu Nakamura, Kyoto (JP); Takaaki Bando, Kyoto (JP); Daisuke Ogasawara, Kyoto (JP); Tsutomu Furukawa, Kyoto (JP); Kazutoshi Matsuda, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 223 days.

(21) Appl. No.: 16/626,884

(22) PCT Filed: Sep. 28, 2018

(86) PCT No.: PCT/JP2018/036166
§ 371 (c)(1),
(2) Date: Dec. 27, 2019

(87) PCT Pub. No.: WO2019/065929
PCT Pub. Date: Apr. 4, 2019

(65) Prior Publication Data
US 2020/0177056 A1 Jun. 4, 2020

(30) Foreign Application Priority Data

Sep. 29, 2017 (JP) .............................. JP2017-190064
Jun. 7, 2018 (JP) .............................. JP2018-109807

(51) Int. Cl.
*H02K 9/20* (2006.01)
*H02K 5/18* (2006.01)
(Continued)

(52) U.S. Cl.
CPC ................ *H02K 9/20* (2013.01); *H02K 5/18* (2013.01); *H02K 5/20* (2013.01); *H02K 9/193* (2013.01);
(Continued)

(58) Field of Classification Search
CPC ............ H02K 1/187; H02K 5/18; H02K 5/20; H02K 9/06; H02K 9/20; H02K 1/20;
(Continued)

(56) References Cited

U.S. PATENT DOCUMENTS 6,113,024 A * 9/2000 Pittard .................. H02K 3/527
242/433
6,624,542 B1 9/2003 Gabrys et al.
(Continued)

FOREIGN PATENT DOCUMENTS

CN 201523301 U 7/2010
CN 203135624 U 8/2013
(Continued)

OTHER PUBLICATIONS

Fakes Michel, Alternator for a Motor Vehicle, Dec. 8, 2005, WO 2005117241 (English Machine Translation) (Year: 2005).*

*Primary Examiner* — Quyen P Leung
*Assistant Examiner* — Alexander A Singh
(74) *Attorney, Agent, or Firm* — Hauptman Ham, LLP

(57) ABSTRACT

In an aspect of the motor of the present invention, the motor includes a shaft centered on a center axis extending in a predetermined direction, and a stator located radially outside of the shaft. The stator has a coil wound around the stator. The motor further includes a housing member having a substantially cylindrical shape with a bottom, where the housing member accommodates substantially the entire stator, and supports the shaft, a cooling medium with which the housing member is filled, where the stator and the coil is immersed in the cooling medium, and a rotor that rotates radially outside of the housing member with the center axis of the shaft as a rotation center.

34 Claims, 30 Drawing Sheets

(51) Int. Cl.
*H02K 5/20* (2006.01)
*H02K 9/193* (2006.01)
*H02K 21/22* (2006.01)
*H02K 11/33* (2016.01)
*H02K 7/08* (2006.01)
*H02K 7/14* (2006.01)

(52) U.S. Cl.
CPC ............ *H02K 21/22* (2013.01); *H02K 7/085* (2013.01); *H02K 7/14* (2013.01); *H02K 11/33* (2016.01); *H02K 2205/09* (2013.01)

(58) Field of Classification Search
CPC .. H02K 9/00; H02K 9/02; H02K 9/04; H02K 9/08; H02K 9/10; H02K 9/12; H02K 9/14; H02K 9/16; H02K 9/18; H02K 9/19; H02K 9/193; H02K 9/197; H02K 9/22; H02K 9/223; H02K 9/225; H02K 9/227; H02K 9/24; H02K 9/26; H02K 9/28; H02K 3/487; H02K 3/34; H02K 3/345; H02K 11/33; H02K 7/085; H02K 7/14; H02K 2205/09
USPC ..... 310/52, 53, 54, 57, 58, 59, 60 R, 61, 62, 310/63, 60 A, 64, 214, 215
See application file for complete search history.

(56) References Cited

U.S. PATENT DOCUMENTS

| | | | | |
|---|---|---|---|---|
| 6,809,442 | B2* | 10/2004 | Kaneko | H02K 9/00 310/58 |
| 6,844,653 | B2* | 1/2005 | Kolomeitsev | H02K 1/148 310/216.082 |
| 6,847,137 | B2* | 1/2005 | Furuse | H02K 16/00 310/58 |
| 2003/0151315 | A1* | 8/2003 | Choi | H02K 3/28 310/58 |
| 2014/0248164 | A1* | 9/2014 | Chang | F04D 29/646 417/354 |
| 2019/0229583 | A1* | 7/2019 | Dextraze | H02K 5/203 |

FOREIGN PATENT DOCUMENTS

| | | | |
|---|---|---|---|
| CN | 105471131 A | 4/2016 | |
| JP | 2007-294726 A | 11/2007 | |
| JP | 2010-284035 A | 12/2010 | |
| JP | 2013188091 A | 9/2013 | |
| JP | 2015-95961 A | 5/2015 | |
| WO | WO-2005117241 A1 * | 12/2005 | ............... H02K 5/20 |

* cited by examiner

MOTOR

CROSS-REFERENCE TO RELATED APPLICATIONS

This is the U.S. national stage of application No. PCT/JP2018/036166, filed on Sep. 28, 2018, and priority under 35 U.S.C. § 119(a) and 35 U.S.C. § 365(b) is claimed from Japanese Applications No. 2017-190064, filed on Sep. 29, 2017 and No. 2018-109807, filed on Jun. 7, 2018.

FIELD OF THE INVENTION

The present invention relates to a motor.

BACKGROUND

For example, a configuration in which a motor coil is cooled by a cooling medium has been known. The motor coil is cooled by self-circulation utilizing expansion and condensation of a cooling medium. Since the motor has a rotor inside the stator, it is an inner rotor type motor. The stator and the rotor are provided in the interior of the housing.

In the motor described above, to circulate the cooling medium, a condenser (condenser) and a flow path to the condenser are required, so that the motor cooling structure will be enlarged. In the motor, since the rotor and the stator are provided in the interior of the housing, heat tends to be trapped in the motor housing.

SUMMARY

In an aspect of the motor of the present invention, the motor includes a shaft centered on a center axis extending in a predetermined direction, and a stator located radially outside of the shaft. The stator has a coil wound around the stator. The motor further includes a housing member having a substantially cylindrical shape with a bottom, where the housing member accommodates substantially the entire stator, and supports the shaft, a cooling medium with which the housing member is filled, where the stator and the coil is immersed in the cooling medium, and a rotor that rotates radially outside of the housing member with the center axis of the shaft as a rotation center.

The above and other elements, features, steps, characteristics and advantages of the present disclosure will become more apparent from the following detailed description of the preferred embodiments with reference to the attached drawings.

DETAILED DESCRIPTION

Figure 1:
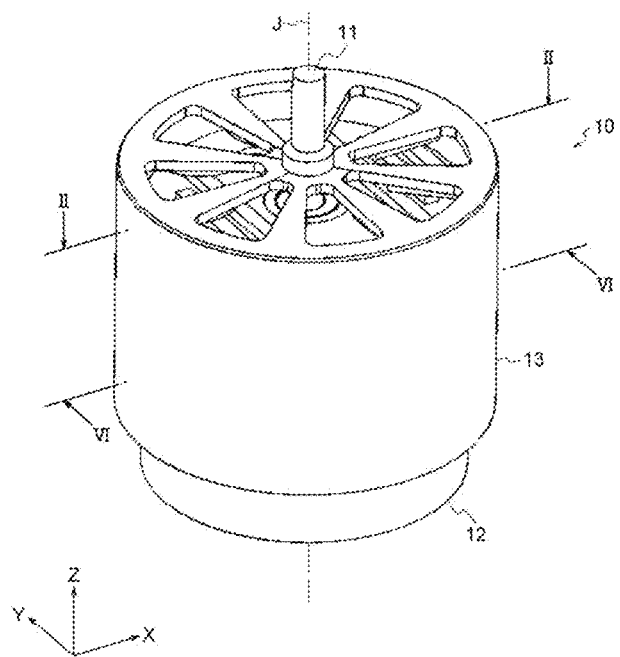
FIG. 1 is a perspective view showing an appearance of a motor according to a first embodiment of the present invention.

Hereinafter, referring to the drawings, a motor according to the first embodiment of the present invention will be described with reference to FIGS. 1 to 11. Further, the scope of the present invention is not limited to the following embodiments, but may be arbitrarily changed within the scope of the technical idea of the present invention. Further, in the following drawings, to easily understand each component, a scale, the number, etc., of each structure may be different from those of actual structures.

In the accompanying drawings, the XYZ coordinate system is shown appropriately as a three-dimensional orthogonal coordinate system. In the XYZ coordinate system, the Z-axis direction is the vertical direction, and is the direction in which the center axis J in FIGS. 1 and 2 extends. The X-axis direction is a direction orthogonal to the Z-axis direction. The X-axis direction is the left-right direction in FIGS. 1 and 2. The Y-axis direction is a direction perpendicular to both the X-axis direction and the Z-axis direction.

In addition, it is assumed in the following description that a direction in which the center axis J extends (that is, the Z-axis direction) is a vertical direction. The positive side (+Z side) in the Z-axis direction with respect to an object may be called the "upper side", and the negative side (−Z side) in the Z-axis direction with respect to an object may be referred to as the "lower side". The front-rear direction, front side, and rear side are made simply for the sake of convenience in description, and are not meant to restrict actual relative positions or directions.

Unless otherwise explained, a direction parallel to the center axis J (Z-axis direction) may be simply referred to as an "axial direction", a radial direction having the center axis J as its center may be simply referred to as a "radial direction", and a circumferential direction having the center axis J as its center, that is, the axial circumference of center axis J, may be simply referred to as a "circumferential direction".

FIG. 1 is a perspective view showing the appearance of a motor 10 according to the embodiment. As shown in FIG. 1, in the external view, the motor 10 of the present embodiment includes a shaft 11 centering on a center axis J extending in the Z direction, a substantially cylindrical housing member 12 having the same center axis as the shaft 11, and a rotor 13 located outside of the housing member. The rotor 13 rotates radially outside of the housing member 12 with the center axis J of the shaft 11 as the center of rotation. The housing member 12 supports the shaft 11. Since the rotor 13 rotates outside the housing member 12, the motor 10 of the present embodiment is an outer rotor type motor. The motor 10 can be used for, for example, a drone or an electric aircraft.

Figure 2:
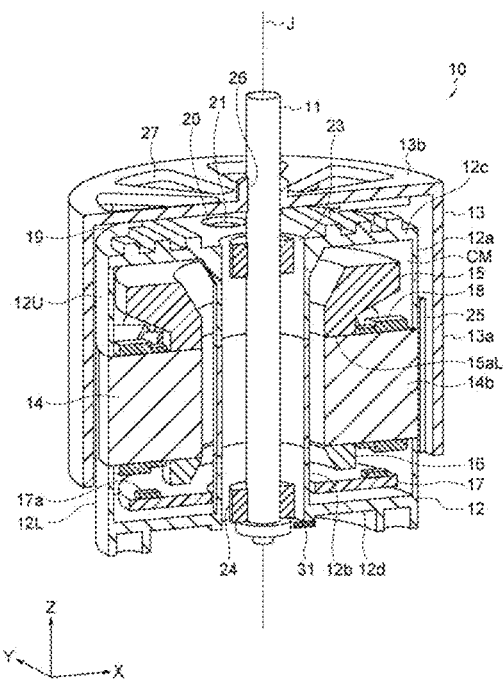
FIG. 2 is a cross-sectional view taken along line II-II in FIG. 1.
Figure 3:
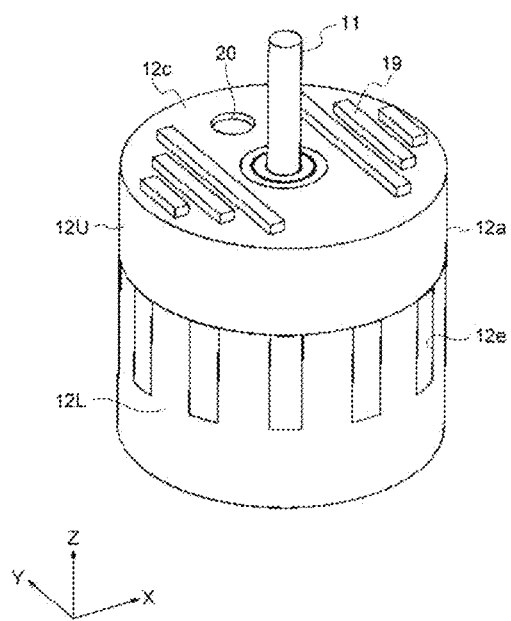
FIG. 3 is an external perspective view of the motor of the first embodiment with the rotor removed.
Figure 4:
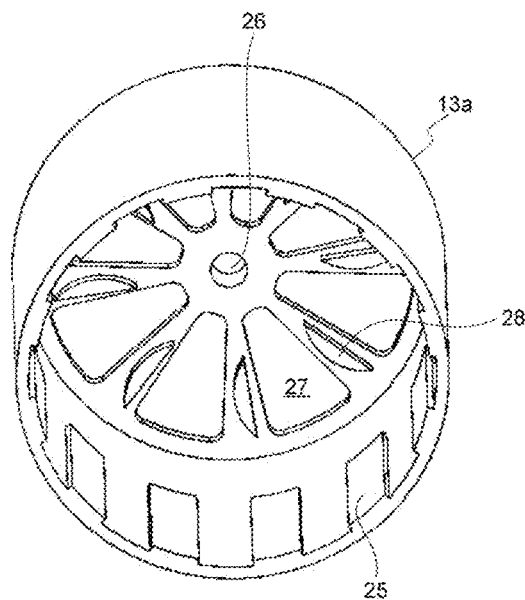
FIG. 4 is a perspective view of the rotor according to the first embodiment as viewed from below.
Figure 5:
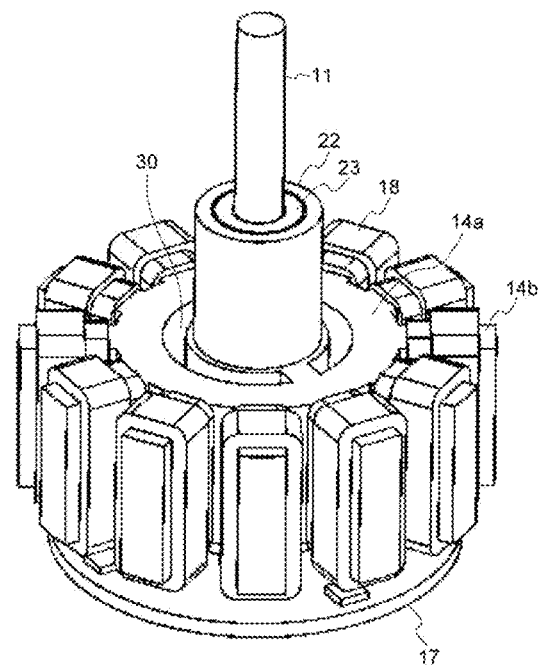
FIG. 5 is a perspective view of the stator according to the first embodiment.
Figure 6:
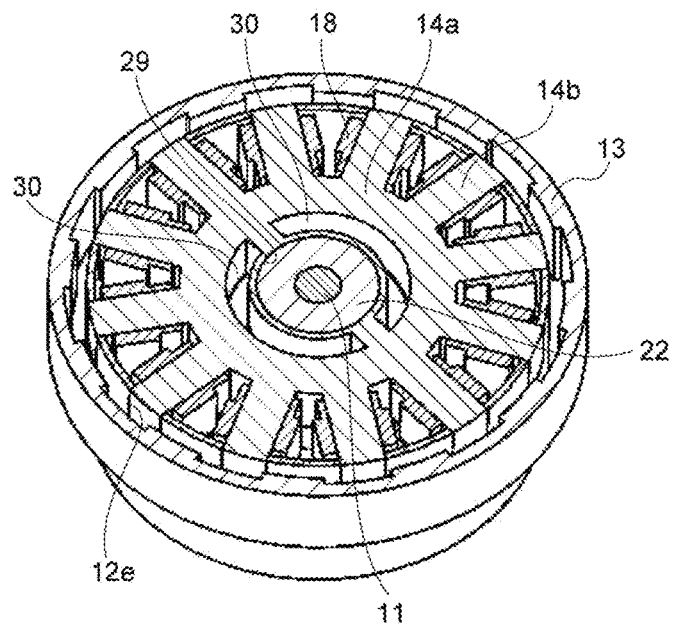
FIG. 6 is a cross-sectional view taken along line VI-VI in FIG. 1.
Figure 7:
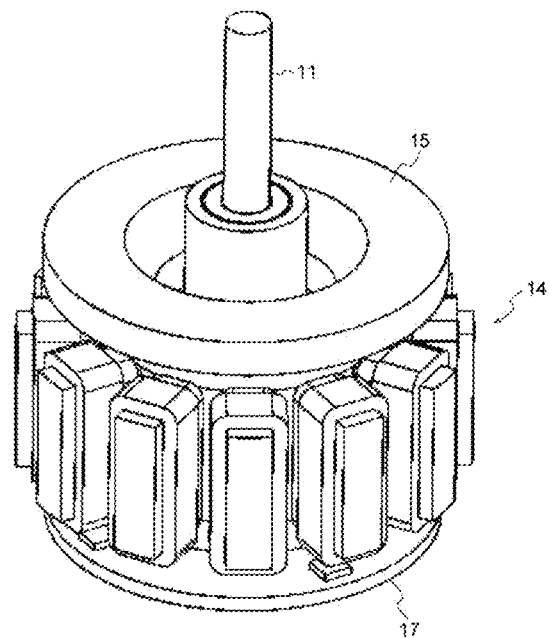
FIG. 7 is a perspective view showing a state where a first annular member is provided on the stator of FIG. 5.
Figure 8:
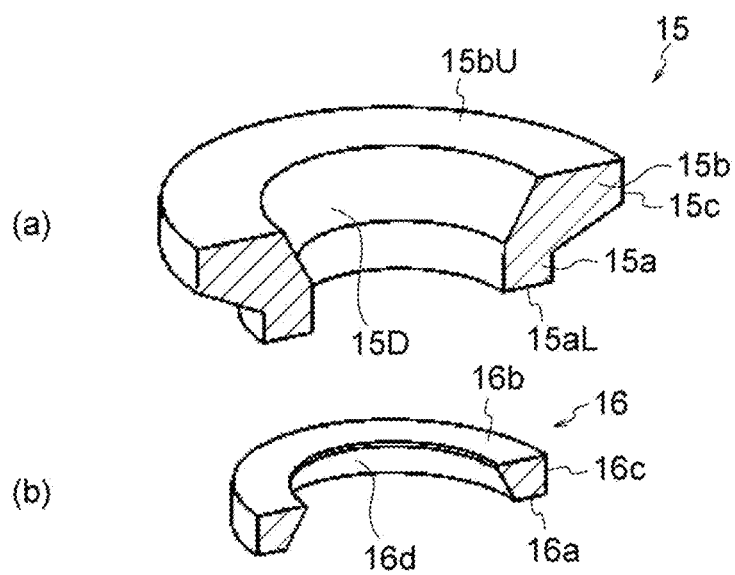
FIG. 8 is a perspective sectional view of two annular members of the first embodiment.

Next, the structure of the motor 10 will be described in detail with reference to FIGS. 2 to 8. FIG. 2 is a cross-sectional view taken along line II-II in FIG. 1, and is a vertical perspective sectional view of the motor 10. FIG. 3 is a perspective view of the motor 10 with the rotor 13 removed, and shows the appearance of the housing member 12. FIG. 4 is a perspective view showing only the rotor 13, and shows a state where the rotor 13 is viewed from below. FIG. 5 is a perspective view of the stator 14. FIG. 6 is a cross-sectional view taken along line VI-VI in FIG. 1, and is a horizontal perspective sectional view of the motor 10. FIG. 7 is a perspective view showing a first annular member 15 (FIG. 2) provided on the upper side of the stator 14. The first annular member 15 has an annular shape. In FIG. 8, (a) is a perspective sectional view of the first annular member 15, and in FIG. 8, (b) is a perspective sectional view of a second annular member 16 (FIG. 2).

As shown in FIG. 2, the motor 10 includes the shaft 11 extending in the axial direction, the rotor 13 fixed to the shaft 11, the housing member 12 located inside the rotor 13, the stator 14 disposed in the hollow interior of the housing member 12, the first annular member 15 provided on the upper side of the stator 14, the second annular member 16 provided on the lower side of the stator 14, and a drive circuit 17 provided below the stator. The stator 14 is located radially outside of the shaft 11 in the interior of the housing member 12. The housing member 12 accommodates substantially the entire stator 14. The output end (not shown) of the shaft 11 is located on the upper side in the Z-axis direction, and for example, when the motor 10 is used for a drone, the driving force of the motor 10 is transmitted via a shaft 11 to a drone body (not shown) located on the upper side of the motor 10.

The housing member 12 includes a cylindrical housing outer peripheral portion 12a centered on the center axis J, a cylindrical housing inner peripheral portion 12b having a smaller diameter than the housing outer peripheral portion 12a, an annular housing upper portion 12c that connects the housing outer peripheral portion 12a and the housing inner peripheral portion 12b on the upper side, and an annular housing lower portion 12d that connects the housing outer peripheral portion 12a and the housing inner peripheral portion 12b on the lower side. The space defined by the housing outer peripheral portion 12a, the housing inner peripheral portion 12b, the housing upper portion 12c, and the housing lower portion 12d is referred to as the hollow interior of the housing member (sometimes referred to as "the interior of the housing member"). The housing member 12 is made of, for example, metal or resin. In the case of the metal, an insulating paint is applied to a predetermined location on the inner surface of the housing member 12. The stator 14 and a drive circuit 17 are provided in the hollow interior of the housing member. The stator 14 has a coil 18 wound around the stator. The hollow interior of the housing member is filled with the cooling medium CM. The cooling medium CM is a liquid at room temperature, and in the interior of the housing member 12, the drive circuit 17 and the coil 18 are immersed in the cooling medium CM. Since the drive circuit 17 and the coil 18 generate heat while the motor 10 is driven, they may be referred to as heating elements in the following description. The coil 18 is provided so as to be in contact with the radially inner face of the housing outer peripheral portion 12a. According to this configuration, since the clearance between the coil 18 and the rotor magnet 25 can be further reduced, it is easy to improve torque performance.

As shown in FIGS. 2 and 3, a heat sink 19 is projected from the axially outer face (upper surface) of the housing upper portion 12c. In the present embodiment, the six heat sinks 19 extend parallel to the Y-axis direction. The three heat sinks 19 are provided at equal intervals on the left side of the shaft 11, and the three heat sinks 19 are provided on the right side at equal intervals. An opening 20 penetrating in the axial direction is provided at a predetermined position of the housing upper portion 12c in the radial direction between the left and right heat sinks 19 whose number is three on each side. The opening 20 is circular when viewed from the axial direction.

The opening 20 is provided with a pressure adjustment element 21 made of a resin material. When the cooling medium CM is vaporized to form bubbles and the pressure inside the housing member increases, the pressure adjustment element 21 is opened. When the pressure adjustment element 21 is opened, the pressure is released via the pressure adjustment element 21, an increase in pressure inside the housing member can be mitigated. By mitigating the pressure increase inside the housing member, it is possible to prevent the boiling point of the cooling medium CM from increasing. Therefore, the cooling medium CM can be vaporized at an appropriate temperature (desired temperature). The pressure adjustment element 21 is, for example, a pressure adjustment rubber. Note that the pressure increase inside the housing member may also occur when the cooling medium CM does not vaporize. For example, when the volume of the cooling medium CM expands due to an increase in the temperature of the cooling medium CM, the pressure inside the housing member increases. Also in this case, the pressure adjustment element 21 is in the open state, and the pressure rise inside the housing member can be suppressed. The pressure value at which the pressure adjustment element 21 is opened is determined based on, for example, the boiling point of the cooling medium.

The cooling medium CM is a substance that can be vaporized by the heat of the heating elements (the drive circuit 17 and the coil 18). The cooling medium CM is, for example, a fluorine-based inert liquid. The cooling medium CM has insulation properties, for example. The type of the cooling medium CM can be selected according to the maximum temperature that the heating element reaches while the motor 10 is driven. The boiling point of the cooling medium CM is lower than the maximum temperature of the heating element.

As shown in FIG. 3, the housing member 12 of the present embodiment has a two-piece structure that can be divided vertically. A lower half (lower piece) 12L of the housing member 12 has a cutout portion 12e that holds the distal end of a tooth portion 14b of the stator 14. When an upper half (upper piece) 12U of the housing member 12 is disposed on the lower half 12L, the cutout portion 12e is an opening penetrating in the radial direction and having a rectangular shape which is long in the axial direction. Therefore, the housing outer peripheral portion 12a is provided with rectangular openings (cutout portions 12e) each of which is long in the axial direction at equal intervals in the circumferential direction. By fitting the tooth portion 14b (FIG. 6) of the stator 14 into this opening (cutout portion 12e), the stator 14 is held by the housing member 12. The inner peripheral portion of the lower half 12L of the housing member 12 supports the core back portion 14a.

As shown in FIG. 2, the inside of the housing inner peripheral portion 12b is a cylindrical space surrounding the shaft 11, and a bearing holder 22 (FIG. 5) is provided in the space. In FIG. 2, the bearing holder 22 is not shown in order to facilitate understanding of the arrangement of other components. As shown in FIG. 5, the bearing holder 22 has a cylindrical shape extending in the axial direction. The shaft 11 extends through the central through hole of the bearing holder 22. The bearing holder 22 is located on the outer periphery of the shaft 11 with a predetermined distance. The bearing holder 22 has a first recess 22a (FIG. 9) at the upper end and a second recess 22b at the lower end. A first bearing 23 is provided in the first recess 22a, and a second bearing 24 is provided in the second recess 22b. The shaft 11 is rotatably supported around the center axis J by the first bearing 23 and the second bearing 24. The bearing holder 22 is made of, for example, aluminum.

As shown in FIG. 2, the rotor 13 is fixed to the shaft 11 and rotates together with the shaft 11. The rotor 13 of the present embodiment is an outer rotor, and rotates radially outside of the housing member with the center axis of the shaft 11 as the center of rotation. A predetermined clearance is provided between the rotor 13 and the housing member 12. As shown in FIGS. 2 and 4, the rotor 13 includes a rotor tube portion 13a surrounded by the housing outer peripheral portion, and a rotor lid 13b covering the housing upper portion. A rotor magnet 25 is provided on the inner surface of the rotor tube portion 13a at a position radially facing a stator 14. In the present embodiment, twelve rotor magnets 25 are arranged at equal intervals in the circumferential direction.

The rotor lid 13b has a disk shape and has a central opening 26 at the center. The shaft 11 extends in the axial direction through the central opening 26 of the rotor lid 13b. The rotor lid 13b is fixed to the shaft 11. Eight fan-shaped openings 27 penetrating in the axial direction are provided around the central opening 26 of the rotor lid 13b. Each of the fan-shaped openings 27 has a fan shape extending outward in the radial direction.

As shown in FIG. 4, the impeller portion 28 that protrudes axially downward is provided on the inner surface of the rotor lid 13b. In the present embodiment, eight impeller portions 28 are located between the eight fan-shaped openings 27. The impeller portion 28 is a member that generates a negative pressure between the rotor lid 13b and a housing upper portion 12c when the rotor 13 rotates. This negative pressure generates an airflow between the rotor 13 and the housing member 12, and the outside air passes through the fan-shaped openings 27 and flows toward the housing upper portion 12c.

As shown in FIGS. 5 and 6, the stator 14 includes a cylindrical core back portion 14a, and a plurality of tooth portions 14b extending radially outward from the core back portion 14a. The core back portion 14a is concentric with the shaft 11 and has a central hole 29 in the axial direction. The tooth portion 14b extends radially outward from the outer peripheral face of the core back portion 14a. The distal end portion of the tooth portion 14b is fitted into an opening (cutout portion) 12e of the housing outer peripheral portion 12a. In the present embodiment, the twelve tooth portions 14b are provided and arranged at equal intervals in the circumferential direction of the core back portion 14a. A coil 18 is wound around each of the tooth portions 14b via a predetermined insulator (not shown). The coils 18 are formed by winding conductive wires. The coil 18 excites the stator 14.

Since the tooth portions 14b around each of which the coil 18 is wound are disposed at intervals in the circumferential direction, a clearance is formed between adjacent tooth portions 14b. The cooling medium CM can flow through this clearance. The core back portion 14a is provided with two through holes 30. The through hole 30 is C-shaped when viewed from the Z-axis direction. The through hole 30 penetrates the core back portion 14a in the axial direction. The bearing holder 22 is fitted in the central hole 29 of the core back portion 14a.

As shown in FIGS. 2 and 7, the first annular member 15 is provided on the stator 14. As shown in FIG. 2, the first annular member 15 extends radially outward and axially upward. The first annular member 15 extends to a position away from the lower side face (inner wall) of the housing upper portion 12c by a predetermined distance. In this way, in this embodiment, in the interior of the housing member 12, the first annular member 15 is positioned on the axially upper side of the stator 14. As shown in (a) of FIG. 8, the first annular member 15 includes an annular base portion 15a, and an enlarged diameter portion 15b that is enlarged obliquely upward from the base portion 15a. A lower face 15aL of the base portion 15a is in contact with the core back portion 14a. The inner diameter and outer diameter of the first annular member 15 are constant at the base portion 15a. The inner diameter and outer diameter of the first annular member 15 increase at the enlarged diameter portion 15b toward the upward side in the axial direction. An upper face 15bU of the enlarged diameter portion 15b is an annular plane. A heat releasing chamber 36 (FIG. 9), which will be described later, is formed between the upper face 15bU of the first annular member 15, the lower surface (inner wall) of the housing upper portion 12c, the inner surface (inner wall) of the housing outer peripheral portion 12a, and the inner surface (inner wall) of the housing inner peripheral portion 12b. The first annular member 15 has an inclined structure with the enlarged diameter portion 15b. The first annular member 15 is a guide member for allowing the cooling medium CM to flow toward the housing outer peripheral portion 12a. The first annular member 15 is made of, for example, aluminum or resin.

As shown in FIG. 2, the second annular member 16 is provided under the core back portion 14a. The second annular member 16 extends axially downward from the lower face of the core back portion 14a. The second annular member 16 extends to a position away from the upper surface (inner wall) of the housing lower portion 12d by a predetermined distance. In this way, in this embodiment, in the interior of the housing member 12, the second annular member 16 is located axially under the stator 14. As shown in (b) of FIG. 8, the second annular member 16 is a substantially annular member. The second annular member 16 has a constant outer diameter and the inner diameter expands downwardly. The second annular member 16 has a shape as a whole extending radially outward and axially downward. A lower face 16a and an upper face 16b of the second annular member 16 are annular planes. The second annular member 16 is made of, for example, aluminum or resin.

As shown in FIG. 2, the drive circuit 17 is, for example, a circuit board and is an example of a circuit element. The drive circuit 17 is a disk-shaped member centered on the center axis of the shaft 11. The drive circuit 17 is provided above the housing lower portion 12d by a predetermined distance. The drive circuit 17 is also away from the stator 14 by a predetermined distance. Power to the drive circuit 17 is supplied from a power line (not shown) connected to the drive circuit 17 from below the housing member 12 via the housing lower portion 12d. On the drive circuit 17, a chip 17a such as a microcomputer is mounted. The microcomputer outputs a motor drive signal.

As shown in FIG. 2, a Hall sensor (Hall element) 31 is attached to the outer surface of the housing lower portion 12d. A sensor magnet (not shown) is attached to the lower end of the shaft 11. The Hall sensor 31 detects the rotational position of the shaft 11 (that is, the rotational position of the rotor 13) by detecting the magnetic field of the sensor magnet using the Hall effect.

Figure 9:
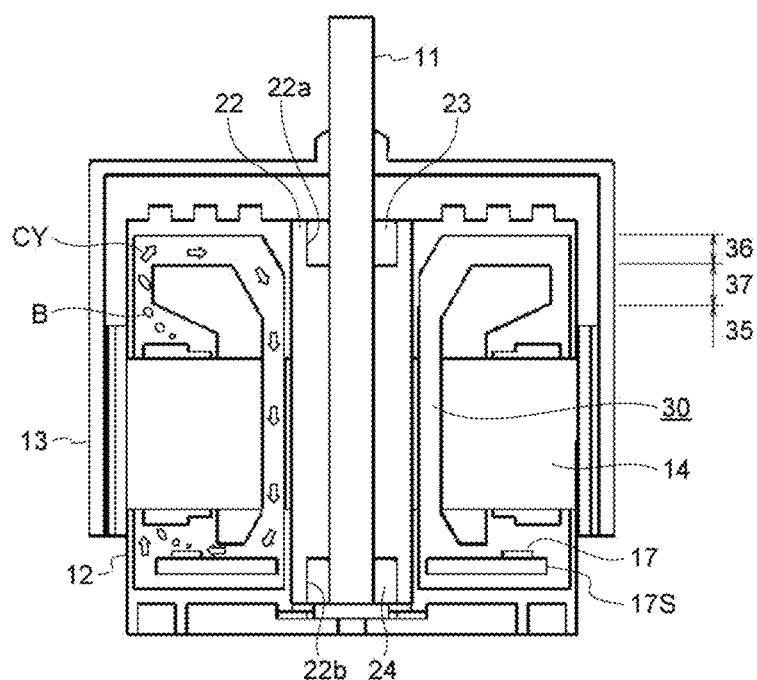
FIG. 9 is a schematic longitudinal sectional view of the motor according to the first embodiment.
Figure 10:
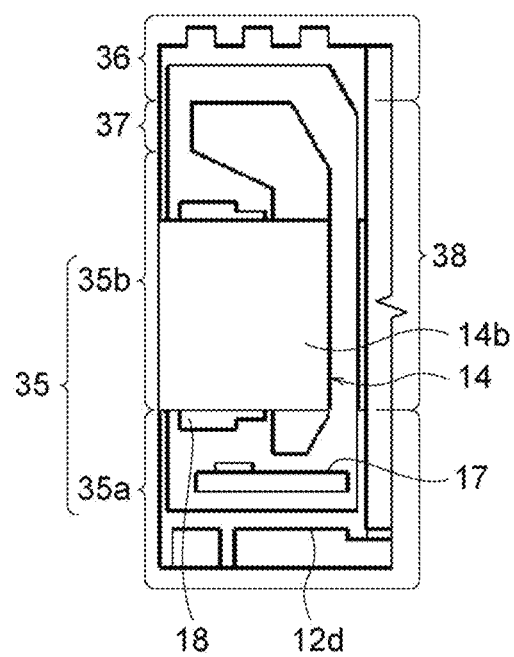
FIG. 10 is a schematic longitudinal sectional view showing a cooling medium flow path according to the first embodiment.
Figure 11:
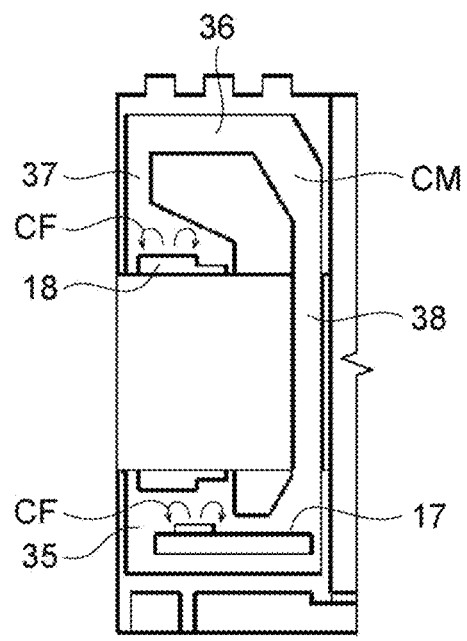
FIG. 11 is a schematic longitudinal sectional view for explaining the movement of the cooling medium at a low temperature.

Next, the cooling structure of the motor 10 of the present embodiment will be described with reference to FIGS. 9 to 11. FIG. 9 is a longitudinal sectional view of the motor 10. FIG. 10 is a schematic sectional view showing a passage through which the cooling medium CM flows in the left half of FIG. 9. FIG. 11 is a schematic cross-sectional view showing the movement of the cooling medium CM at a low temperature.

As shown in FIG. 9, the stator 14 and the drive circuit 17 are provided in the hollow interior of the housing member 12. In this embodiment, as shown in FIG. 10, in the hollow interior of the housing member 12, the space other than the stator 14 and the drive circuit 17 is defined by a cooling chamber 35, the heat releasing chamber 36, a first connection path 37, and a second connection path 38. The cooling chamber 35, the heat releasing chamber 36, the first connection path 37, and the second connection path 38 are filled with the cooling medium CM.

As shown in FIGS. 9 and 10, the cooling chamber 35 is provided so as to accommodate the drive circuit 17, the second annular member 16, and the coil 18 from the lower side of the interior of the housing member. More specifically, the cooling chamber 35 includes a space from the upper face of a lower portion 12d of the housing member 12 to the lower end of the through hole 30 of the core back portion 14a, and a space from the upper face of the lower portion 12d of the housing member 12 to the lower face of the tooth portion 14b, and further includes a space between the tooth portions 14b along the inner face of the outer peripheral portion 12a of the housing member 12, and a space from the upper face of the tooth portion 14b to the lower end of an outer peripheral face 15c of the first annular member 15. The heat releasing chamber 36 is provided on the upper side of the interior the housing member. More specifically, the heat releasing chamber 36 includes a space from the upper face 15bU of the enlarged diameter portion 15b of the first annular member 15 to the lower face of an upper portion 12c of the housing member 12. The first connection path 37 and the second connection path 38 connect the cooling chamber 35 and the heat releasing chamber 36. In the present embodiment, the first connection path 37 and the second connection path 38 extend in the vertical direction (Z-axis direction). The first connection path 37 includes a space between the outer peripheral face 15c of the first annular member 15 and the inner face of the outer peripheral portion 12a of the housing member 12. The end portion on the lower side of the first connection path 37 in the vertical direction is connected to the outlet side end portion on the upper side of the cooling chamber 35 in the vertical direction. An end portion on the upper side of the first connection path 37 in the vertical direction is connected to the inlet side end portion on the lower side of the heat releasing chamber 36 in the vertical direction. The second connection path 38 includes a space between an inner peripheral face 15d of the first annular member 15 and the inner face of an inner peripheral portion 12b of the housing member 12, and the through hole 30 of the core back portion 14a. The end portion on the lower side of the second connection path 38 in the vertical direction is connected to the inlet side end portion on the upper side of the cooling chamber 35 in the vertical direction. The end portion on the upper side of the second connection path 38 in the vertical direction is connected to the outlet side end portion on the lower side of the heat releasing chamber 36 in the vertical direction.

The minimum dimension of the first connection path 37 in the direction (X-axis direction, Y-axis direction) orthogonal to the direction (Z-axis direction) in which the first connection path 37 extends is a size with which at least part of the vaporized cooling medium CM stays in the first connection path 37. In the present embodiment, the minimum dimension of the first connection path 37 in the direction orthogonal to the direction in which the first connection path 37 extends is a dimension in the radial direction between the first annular member 15 and the housing outer peripheral portion 12a.

The cooling chamber 35 cools the drive circuit 17 and the stator 14 (coil 18), which are heating elements. The cooling chamber 35 includes a first cooling space 35a that is a space that roughly surrounds the drive circuit 17, and a second cooling space 35b that is a space that is formed above the first cooling space 35a and reaches the vicinity of the outer peripheral face 15c of the first annular member 15 (in the following description, the first cooling space may be referred to as a first cooling chamber, and the second cooling space may be referred to as a second cooling chamber). In the present embodiment, it is assumed that the drive circuit 17 is located in a first cooling chamber 35a and the coil 18 is located in a second cooling chamber 35b. The first cooling chamber 35a and the second cooling chamber 35b are continuous, and the cooling chamber 35 is constituted by the two cooling chambers. The heating elements (the drive circuit 17 and the coil 18) are accommodated in the cooling chamber 35.

As shown in FIGS. 2 and 10, a plurality of tooth portions 14b and the coils 18 of the stator 14 are located in the second cooling chamber 35b. The cooling medium CM flows from the first cooling chamber 35a to the second cooling chamber 35b. When the cooling medium CM passes through the second cooling chamber 35b, it flows through the clearances between the tooth portions 14b and the coils 18 of the stator 14.

The first connection path 37 extends axially upward from the cooling chamber 35 along the housing outer peripheral portion 12a and reaches the heat releasing chamber 36. The first connection path 37 is defined by the outer peripheral face 15C of the enlarged diameter portion of the first annular member 15 and the inner surface of the housing outer peripheral portion 12a.

The heat releasing chamber 36 is formed under the housing upper portion 12c. The heat releasing chamber 36 releases the heat of the cooling medium CM to the outside. The heat releasing chamber 36 is located axially above the coil 18 (stator 14), which is a heating element. The heat releasing chamber 36 is an annular space. The heat sink 19 is provided on the upper side of the heat releasing chamber 36 in the vertical direction. The heat sink 19 is an example of a heat absorbing unit. The heat sink 19 absorbs heat from the cooling medium CM in the heat releasing chamber 36. The configuration of the heat absorbing unit is not limited to the heat sink as long as heat can be absorbed from the cooling medium CM in the heat releasing chamber 36. The heat sink 19 is made of a member having a relatively high thermal conductivity, for example. The impeller portion 28 provided on the lower side of the rotor lid generates a negative pressure between the rotor lid 13b and the housing upper portion 12c when the rotor 13 rotates, this negative pressure generates an airflow, and a housing upper portion 12a is cooled (the air can be blown into the heat releasing chamber 36). Therefore, the impeller portion 28 formed on the rotor lid 13b also promotes heat release from the heat releasing chamber 36.

The second connection path 38 extends axially downward from the heat releasing chamber 36 along the housing inner peripheral portion 12b and reaches the cooling chamber 35. The second connection path 38 is defined by the inner peripheral face 15D of the first annular member 15 and the through hole 30 provided in the core back portion 14a.

Next, the circulation of the cooling medium CM and the cooling of the heating element in the present embodiment will be described with reference to FIGS. 9 and 11.

The cooling in the present embodiment has three cooling phases, that is, a first cooling phase, a second cooling phase, and a third cooling phase. In the present embodiment, the three cooling phases are appropriately switched according to the temperature of the heating element, and the heating element can be efficiently cooled. The three cooling phases are switched between the first cooling phase, the second cooling phase, and the third cooling phase in this order as the temperature of the heating element increases.

FIG. 11 shows the movement of the cooling medium in the first cooling phase. As shown in FIG. 11, the first cooling phase is a phase for cooling the heating elements (the drive circuit 17 and the coil 18) by convection CF of the cooling medium CM generated in the cooling chamber 35. When the motor 10 is started and the temperature of the heating elements starts to rise, the temperature of the cooling medium CM located around the heating element also rises. As a result, the temperature of the cooling medium CM rises in the cooling chamber 35, and the convection CF is generated. That is, in this embodiment, when the temperature of the cooling medium CM rises, the convection CF of the cooling medium CM occurs in the cooling chamber 35.

When the convection CF is generated, the cooling medium CM in the cooling chamber 35 is agitated by the convection CF. Thereby, the cooling medium CM located around the heating element can be circulated in the cooling chamber 35, and the heating element can be cooled. In the first cooling phase, the temperature of the heating element is lower than the boiling point of the cooling medium CM.

In the present embodiment, the cooling chamber 35 and the heat releasing chamber 36 are connected only by the first connection path 37 and the second connection path 38. For this reason, in the state of FIG. 11, the circulation of the cooling medium CM hardly occurs between the cooling medium CM in the cooling chamber 35 and the cooling medium CM in the heat releasing chamber 36.

When it is difficult for the cooling medium CM to circulate between the cooling chamber 35 and the heat releasing chamber 36, heat exchange between the cooling chamber 35 and the heat releasing chamber 36 is difficult. Since the cooling medium CM in the cooling chamber 35 absorbs the heat of the heating element and releases the heat to the outside, the temperature of the cooling medium tends to be relatively low. In the state of FIG. 11, the temperature of the cooling medium CM in the heat releasing chamber 36 is kept relatively low.

When there is no circulation of the cooling medium CM between the cooling chamber 35 and the heat releasing chamber 36, the temperature of the cooling medium CM is kept relatively low also in the first connection path 37 and the second connection path 38 that connect the cooling chamber 35 and the heat releasing chamber 36. In particular, since the first connection path 37 is close to the outside air, the temperature of the cooling medium CM is kept low. The cooling in the first cooling phase is cooling when the temperature of the cooling medium CM is relatively low.

When the temperature of the heating element rises from the state of FIG. 11, the heating element cannot be cooled sufficiently in the first cooling phase, and the temperature of the heating element is equal to or higher than the boiling point of the cooling medium CM, the cooling phase shifts from the first cooling phase to the second cooling phase. In the second cooling phase, it is assumed that although the cooling medium begins to vaporize, the amount of vaporization is small, and circulation CY (FIG. 9) of the cooling medium CM hardly occurs between the cooling chamber 35 and the heat releasing chamber 36.

The second cooling phase is a phase in which the heating element is cooled by the convection CF of the cooling medium CM and vaporization of the cooling medium CM.

In the second cooling phase, when the temperature of the heating element is equal to or higher than the boiling point of the cooling medium CM, the cooling medium CM around the heating element vaporizes, and bubbles made of the gas of the cooling medium CM are generated. Therefore, the heat of the heating element is absorbed by the latent heat when the cooling medium CM is vaporized, and the heating element is cooled.

Thus, in the second cooling phase, the heating element is cooled not only by the convection CF but also by the evaporation of the cooling medium CM. Therefore, the effect of cooling the heating element in the second cooling phase is greater than the effect of cooling the heating element in the first cooling phase.

The bubbles generated in the second cooling phase rise upward in the vertical direction (+Z side), and move into the first connection path 37, for example. In the second cooling phase, since the circulation CY of the cooling medium CM hardly occurs between the cooling chamber 35 and the heat releasing chamber 36, the temperature of the cooling medium CM in the first connection path 37 is kept relatively low. As a result, the bubbles that have moved in the first connection path 37 condensed and return to liquid again.

In the second cooling phase, the bubbles may move to the heat releasing chamber 36 via the first connection path 37. Since in the heat releasing chamber 36, the temperature of the cooling medium CM is kept relatively low, the bubbles that have moved into the heat releasing chamber 36 are condensed, and return to liquid again. That is, when the cooling medium CM in the cooling chamber 35 is vaporized, at least part of the vaporized cooling medium CM is condensed in either the first connection path 37 or the heat releasing chamber 36.

When the heating element is cooled by the second cooling phase, and the temperature of the heating element is lower than the boiling point of the cooling medium CM, the cooling phase returns from the second cooling phase to the first cooling phase.

On the other hand, when in the second cooling phase, the heating element cannot be cooled sufficiently, and the temperature of the heating element rises, and the amount of the cooling medium CM that evaporates increases to some extent, the cooling phase shifts from the second cooling phase to the third cooling phase.

FIG. 9 shows the flow of the cooling medium CM in the third cooling phase. As shown in FIG. 9, the third cooling phase is a phase for cooling the heating element by the vaporization of the cooling medium CM, and the circulation CY of the cooling medium CM generated between the cooling chamber 35 and the heat releasing chamber 36. In FIG. 9, although the refrigerant circulation CY and bubbles B are shown only in the left half of housing member 12, similar circulation CY and bubbles B are generated also in the right half of the housing member 12.

When the temperature of the heating element rises, the amount of the cooling medium CM (bubbles B) that vaporizes increases. The minimum dimension of the first connection path 37 is a value at which the bubbles B that are the vaporized cooling medium CM are likely to stay in the first connection path 37. Therefore, when the amount of the bubbles B increases, the bubbles B stay in the first connection path 37. As a result, a pressure difference is generated between the upper end of the first connection path 37 and the upper end of the second connection path 38. That is, the pressure at the upper end of the first connection path 37 is smaller than the pressure at the upper end of the second connection path 38. Due to this pressure difference, the cooling medium CM in the second connection path 38 moves downward in the vertical direction due to gravity and flows into the cooling chamber 35. When the cooling medium CM in the second connection path 38 flows into the cooling chamber 35, part of the cooling medium CM in the cooling chamber 35 is pushed out to the first connection path 37, and moves to the heat releasing chamber 36 via the first connection path 37. Along with the inflow of the cooling medium CM from the first connection path 37 and the outflow of the cooling medium CM from the second connection path 38, part of the cooling medium CM in the heat releasing chamber 36 is pushed out to the second connection path 38, and moves to the cooling chamber 35 via the second connection path 38. Thereby, the circulation CY of the cooling medium CM occurs between the cooling chamber 35 and the heat releasing chamber 36. The second annular member 16 regulates the flow (backflow) of the cooling medium CM (bubbles B) from the cooling chamber 35 to the second connection path 38.

As described above, in the third cooling phase, when part of the cooling medium CM in the cooling chamber 35 is vaporized, the vaporized cooling medium CM (bubbles B) moves into the first connection path 37. In the third cooling phase, the circulation CY is generated in which the cooling medium CM in the cooling chamber 35 flows to the heat releasing chamber 36 via the first connection path 37 and the cooling medium CM of the heat releasing chamber 36 flows to the cooling chamber 35 via the second connection path 38. The cooling medium that has entered the heat releasing chamber 36 from the first connection path 37 is cooled in the heat releasing chamber 36, and the bubbles B return to liquid.

In the first cooling phase and the second cooling phase, since the temperature of the cooling medium CM in the heat releasing chamber 36 is kept relatively low, the heating element can be sufficiently cooled by moving the cooling medium CM in the heat releasing chamber 36 into the cooling chamber 35 by the circulation CY. The temperature of the refrigerant medium CM falls, in the heat releasing chamber 36, to, for example, about room temperature/environment temperature.

Thus, in the third cooling phase, in addition to vaporization of the cooling medium CM, the heating element is also cooled by the circulation CY of the cooling medium CM. Therefore, the effect of cooling the heating element in the third cooling phase is greater than the effect of cooling the heating element in the second cooling phase. In the third cooling phase, the flow rate of the circulation CY of the cooling medium CM caused by gravity is faster than the flow rate of the convection CF of the cooling medium CM. As a result, the effect of cooling the heating element is improved.

When the circulation CY of the cooling medium CM occurs, the cooling medium CM in the cooling chamber 35 having a relatively high temperature flows into the heat releasing chamber 36. However, since the heat releasing chamber 36 releases the heat of the cooling medium CM to the outside, the cooling medium CM flowing in from the cooling chamber 35 and having a relatively high temperature is cooled in the heat releasing chamber 36 to become the cooling medium CM having a relatively low temperature to flow again into the cooling chamber 35. When the circulation CY of the cooling medium CM occurs, the cooling medium CM that has passed through the heat releasing chamber 36 moves downward through the second connection path 38 due to the self weight, and reaches the cooling chamber 35.

In the third cooling phase, the bubbles B present in the first connection path 37 move to the heat releasing chamber 36 together with the cooling medium CM that is liquid by the circulation CY of the cooling medium CM, and are condensed.

As described above, in this embodiment, depending on the temperature of the heating element, the cooling phase automatically changes between the first cooling phase and the third cooling phase. Thus, an appropriate cooling phase is executed according to the temperature of the heating element, and the heating element can be efficiently cooled. In the second cooling phase and the third cooling phase, since the heating element is cooled using the boiling of the cooling medium, it can be said that the motor 10 has a cooling structure using boiling cooling.

According to the present embodiment, as described above, the heating element can be effectively cooled by the convection, the vaporization, and the circulation CY of the cooling medium CM. Therefore, the cooling efficiency of the motor 10 can be improved. Further, for example, the amount of the cooling medium CM to be vaporized can be reduced as compared with the case where the heating element is cooled only by vaporizing the cooling medium CM. Thereby, it is not necessary to provide a large condenser for condensing the bubbles B, and an increase in the cooling structure of the motor 10 can be suppressed.

According to this embodiment, by using bubbles B, and using the gravity acting on the cooling medium CM as the driving force, the circulation CY of the cooling medium CM can be generated. As a result, in the cooling medium CM, the flow rate of the circulation CY is faster than the flow rate of the convection CF. Therefore, according to the present embodiment, the cooling efficiency of the motor 10 can be improved.

According to this embodiment, the generated bubbles B are condensed in either the first connection path 37 or the heat releasing chamber 36 where the temperature of the cooling medium CM is kept relatively low. Therefore, it is not necessary to provide a condenser. Further, since the rotor 13 is provided outside of the housing member 12, heat is not easily trapped in the interior of the housing member 12. When the rotor 13 rotates, an air current is generated between the rotor 13 and the housing member 12 by an impeller 28 provided on the rotor 13. Since this air flow cools the heat releasing chamber 36, the heat releasing chamber 36 can be kept at a low temperature.

According to the present embodiment, the entire heat releasing chamber 36 is located above the cooling chamber 35 in the vertical direction. For this reason, in the third cooling phase, it is easy to cause the circulation CY of the cooling medium CM between the cooling chamber 35 and the heat releasing chamber 36 utilizing the gravity of the cooling medium CM.

According to this embodiment, the first annular member 15 is located on the axially upper side of the stator 14 in the interior of the housing member, and the first annular member extends radially outward and axially upward. Therefore, in the first annular member 15 having an inclined structure by the enlarged diameter portion, the cooling medium CM (bubbles B) is guided so as to flow toward the housing outer peripheral portion 12a. Since the housing outer peripheral portion 12a is in contact with the outside air and is air-cooled by the rotation of the rotor 13, it is kept at a low temperature. Therefore, the cooling medium CM (bubbles B) is easily cooled in the first connection path 37.

According to this embodiment, the second annular member 16 is located on the axially lower side of the stator 14 in the interior of the housing member, the second annular member extends radially outward and axially downward. Therefore, the second annular member 16 restricts the bubbles B generated in the vicinity of the drive circuit 17 flowing from the cooling chamber 35 to the second connection path 38.

According to this embodiment, the drive circuit 17 and the coil 18 which are heating elements are accommodated in the cooling chamber 35, and are immersed in the insulating cooling medium CM. That is, the cooling medium CM is in direct contact with the heating element. Therefore, the heating element can be more easily cooled by the cooling medium CM, and the cooling efficiency of the motor 10 can be further improved.

The motor 10 of this embodiment performs cooling by liquid immersion boiling cooling using boiling of the cooling medium CM. Therefore, the motor 10 of this embodiment has higher cooling performance than air cooling. In this embodiment, since the coil 18 and the drive circuit 17 are located in the cooling chamber 35, the coil 18 and the drive circuit 17 can be cooled integrally.

Therefore, the motor 10 of this embodiment can improve the cooling efficiency without increasing the cooling structure. As the motor is smaller and more powerful, the heat generated by the motor may increase. As motors become smaller and more powerful, motors with excellent cooling performance, such as the motor 10 of this embodiment, are required.

Further, in the motor 10 according to this embodiment, the following configuration may also be used.

In this embodiment, although the shaft 11 is centered on the center axis extending in the Z direction, a center axis extending in a predetermined direction other than the Z direction may be the center.

The cooling medium CM may not have insulation properties. For example, the cooling medium CM may be water. In this case, an insulation process is performed on components (for example, the drive circuit 17 and the coil 18) that come into contact with the cooling medium.

The drive circuit 17 may not be provided in the hollow interior of the housing member 12. In this case, the heating element cooled by the cooling medium CM is the coil 18.

Although the housing member 12 is composed of the housing outer peripheral portion 12a, the housing inner peripheral portion 12b, the housing upper portion 12c and the housing lower portion 12d, the housing member 12 may have a substantially cylindrical shape with a bottom. In this case, a lid is provided instead of the housing upper portion 12c.

Although the impeller portion 28 that generates a negative pressure between the rotor 13 and the housing member 12 as the rotor 13 rotates is provided on the inner surface of the rotor lid 13b, it may be provided also in the inner surface of the rotor tube portion 13a.

Although the housing member 12 has a two-piece structure that can be divided vertically, it may have another structure (for example, 1 piece structure or 3 piece structure).

The number of through holes 30 is not limited to two. For example, it may be one, or three or more.

Although the first bearing 23 and the second bearing 24 are held by the bearing holder 22, the first bearing 23 and the second bearing 24 may be held by the housing member 12. In this case, the bearing holder 22 may be omitted. Further, instead of the bearing holder 22, a bracket is provided between the housing member 12 and the bearings 23 and 24, and the bearings 23 and 24 may be held by the bracket. Further, the rotor 13 may hold the first bearing 23. In this case, the shaft 11 does not rotate, and the rotor serves as a shaft-fixed outer rotor.

The cross-sectional shape (XY cross-section) orthogonal to the direction in which the first connection path 37 extends (Z-axis direction) is not limited to the illustrated shape. The cross-sectional shape (XY cross-section) orthogonal to the direction in which the second connection path 38 extends (Z-axis direction) is not limited to the illustrated shape.

The minimum dimension of the first connection path 37 in the direction (X-axis direction, Y-axis direction) orthogonal to the direction (Z-axis direction) in which the first connection path 37 extends may not be a size with which at least part of the vaporized cooling medium CM stays in the first connection path 37. That is, if the circulation CY of the cooling medium CM occurs in the path of the cooling chamber 35→the first connection path 37→the heat releasing chamber 36→the second connection path 38→the cooling chamber 35, the minimum cross-sectional dimension is not particularly limited.

The stator 14 may not have a radially inner portion (portion in which the through hole 30 is formed) of the core back portion 14a. Since the tooth portion 14b is held by the housing outer peripheral portion 12a, the stator 14 can be held by the housing member 12 without the radially inner portion of the core back portion 14a. In this case, although the through hole 30 is not provided in the core back portion 14a, when there is no radially inner portion of the core back portion 14a, the space occupied by the portion is vacant, so that a passage in place of the through hole 30 is formed.

Note that a device to which the motor 10 of the present embodiment is applied is not particularly limited, and may be mounted on a device other than a drone or an electric aircraft.

Moreover, respective structures mentioned above can be combined suitably in the range in which they do not contradict each other.

Hereinafter, a motor according to the second embodiment of the present invention will be described with reference to FIGS. 12 to 27. The same components as those in the first embodiment are denoted by the same reference signs, and detailed description thereof is omitted. The same cooling medium CM as that of the first embodiment is used.

Figure 12:
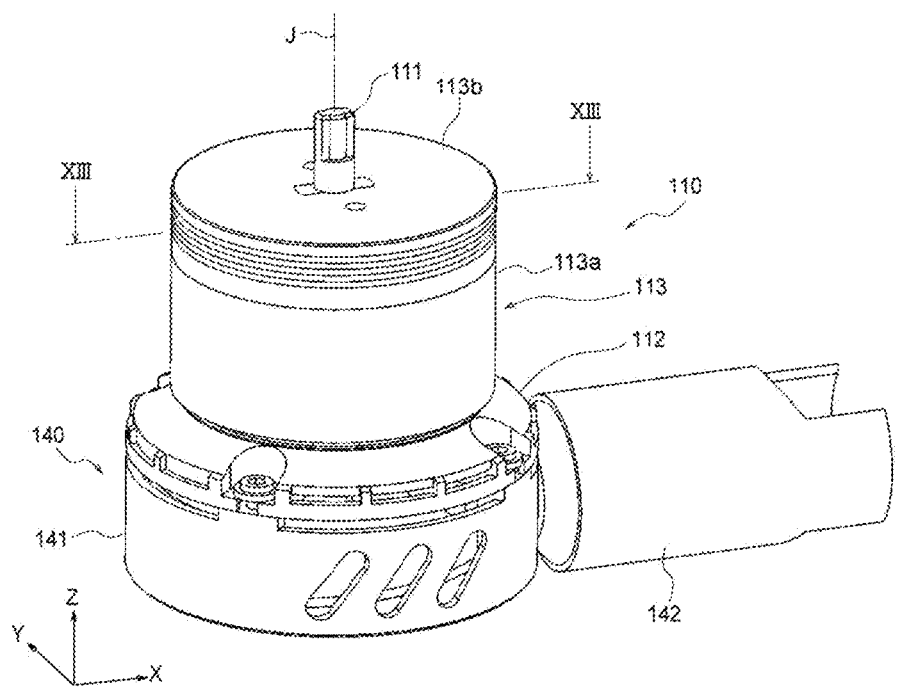
FIG. 12 is a perspective view showing an appearance of a motor according to a second embodiment.

FIG. 12 is a perspective view showing an appearance of a motor 110 according to the second embodiment. As shown in FIG. 12, in the external view, a motor 110 includes a shaft 111 centering on a center axis J extending in the Z direction, a substantially cylindrical housing member 112 having the same center axis as the shaft 111, and a rotor 113 located outside of the housing member 112. The rotor 113 includes a rotor tube portion 113a and a rotor lid 113b. The motor 110 also has a motor base portion 140 located below the housing member 112. The motor base portion 140 includes an annular body 141 having a predetermined height, and a cylindrical pipe portion 142 connected to the outer peripheral wall of the body 141. The rotor 113 rotates radially outside of the housing member 112 with the center axis J of the shaft 111 as the rotation center. The housing member 112 supports the shaft 111. Since the rotor 113 rotates radially outside of the housing member 112, the motor 110 of the present embodiment is also an outer rotor type motor. The motor 110 can be used for, for example, a drone or an electric aircraft. A direction in which the center axis J extends is referred to as the Z direction, a direction in which the pipe portion 142 extends is referred to as the X direction, and a direction perpendicular to the Z direction and the X direction is referred to as the Y direction.

Figure 13:
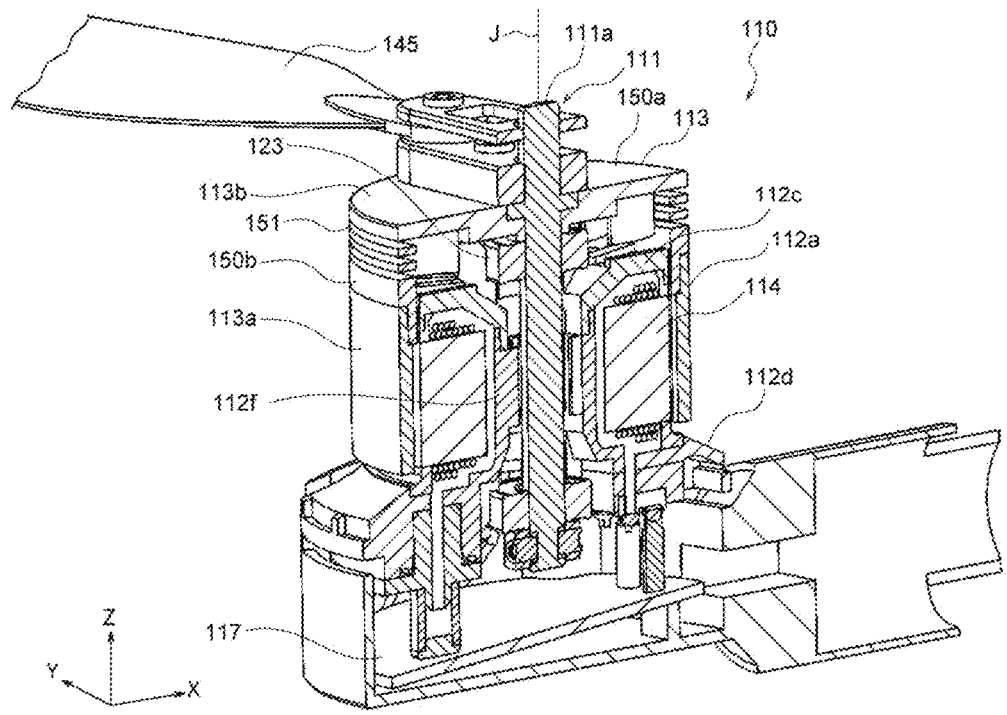
FIG. 13 is a vertical sectional view taken along line XIII-XIII in FIG. 12.
Figure 14:
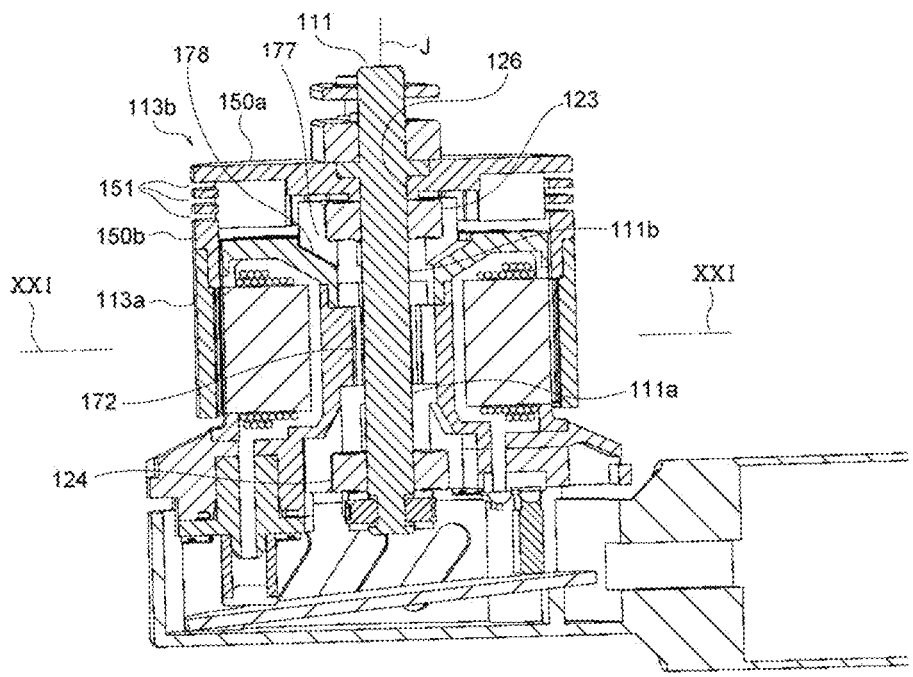
FIG. 14 is a diagram of FIG. 13 viewed from the Y direction.

Next, the structure of the motor 110 will be described in detail with reference to FIGS. 13 to 27. FIG. 13 is a vertical sectional view taken along line XIII-XIII in FIG. 12. FIG. 14 is a diagram of FIG. 13 viewed from the Y direction.

As shown in FIG. 13, the motor 110 includes a shaft 111 extending in a direction of the center axis J, the rotor 113 fixed to the shaft 111, the housing member 112 located radially inside the rotor 113, a stator 114 located in the interior of the housing member 112, and a drive circuit board 117 provided below the stator. The stator 114 is located outside of the shaft 111 in the radial direction in the interior of the housing member 112. For example, when the motor 110 is used for a drone, the driving force of the motor 110 is transmitted to a blade 145 located on the upper side of the motor 110 via an output end 111a of the shaft 111.

The rotor 113 is fixed to the shaft 111 and rotates together with the shaft 111. The rotor 113 rotates radially outside of the housing member 112 with the center axis J of the shaft 111 as the rotation center. A predetermined clearance is provided between the rotor 113 and the housing member 112. The rotor 113 includes the rotor tube portion 113a surrounding the housing outer portion, and the rotor lid 113b that covers the housing upper portion. Rotor magnets 125 (FIG. 23) are provided on the inner surface of the rotor tube portion 113a at a position radially facing the stator 114. The rotor magnets 125 are arranged at equal intervals in the circumferential direction.

As shown in FIGS. 13 and 14, the rotor lid 113b includes a disk-shaped top portion 150a, a cylindrical portion 150b extending axially downward from the top portion. The cylindrical portion 150b has a rotor opening 151 that opens in a direction perpendicular to the center axis J. The rotor opening 151 of the present embodiment is an opening that penetrates the cylindrical portion 150b in the radial direction, and as shown in FIG. 15B, a plurality of the rotor openings 151 is provided at predetermined intervals in the circumferential direction and the axial direction of the cylindrical portions 150b. The shaft 111 extends in the axial direction through a central opening 126 (FIG. 15A) of the rotor lid 113b. The rotor lid 113b is fixed to the shaft 111. The lower side portion of a lower portion 112d of the housing member 112 is located in the motor base portion 140. In addition, a space filled with a cooling medium is provided at the lower portion 112d of the housing member 112.

Figure 15A:
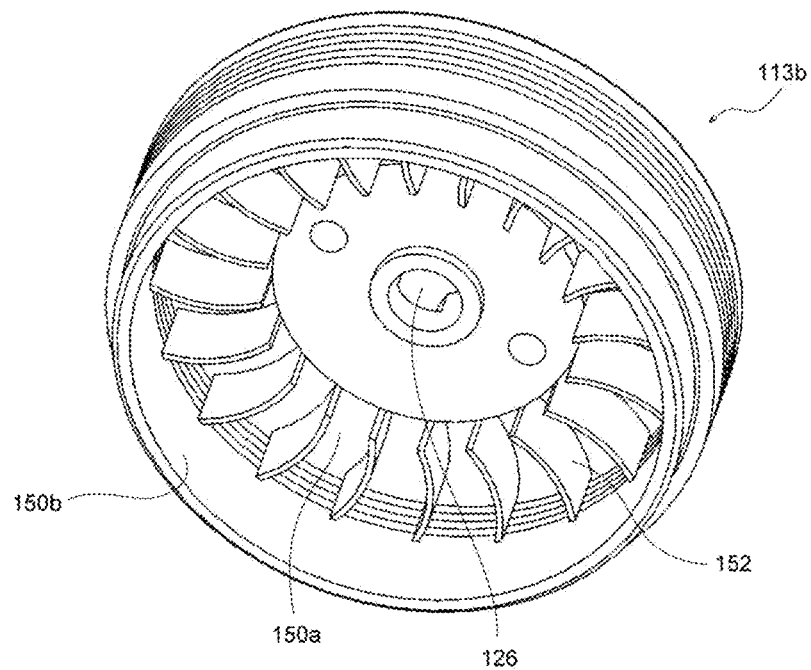
FIG. 15A is a perspective view of a rotor lid viewed from below.
Figure 15B:
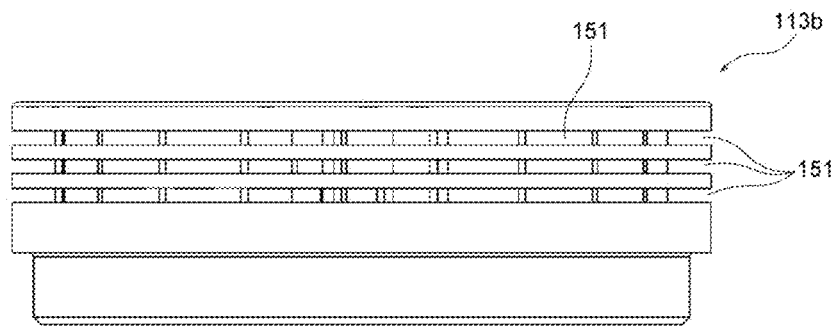
FIG. 15B is a diagram of the rotor lid viewed from the Y direction.

FIG. 15A is a perspective view of the rotor lid 113b viewed from below. As shown in FIG. 15A, a plurality of fins 152 extends axially downward from the inner surface of the top portion 150a of the rotor lid 113b. Each of the fins 152 is a substantially rectangular plate member that is gently bent. The fins 152 are provided at predetermined intervals in the circumferential direction. When the rotor 113 rotates, the fins 152 generate a negative pressure between the rotor lid 113b and a housing upper portion 112c. This negative pressure generates an air flow between the rotor 113 and the housing 112, and air passes through the rotor opening 151 and flows into the rotor 113, and flows toward a housing upper portion 112c. Since the rotor lid 113b generates an air flow for cooling the motor 110, it can be said that it is a first cooling fan. FIG. 15B is a diagram of the rotor lid 113b viewed from the Y direction.

Figure 16:
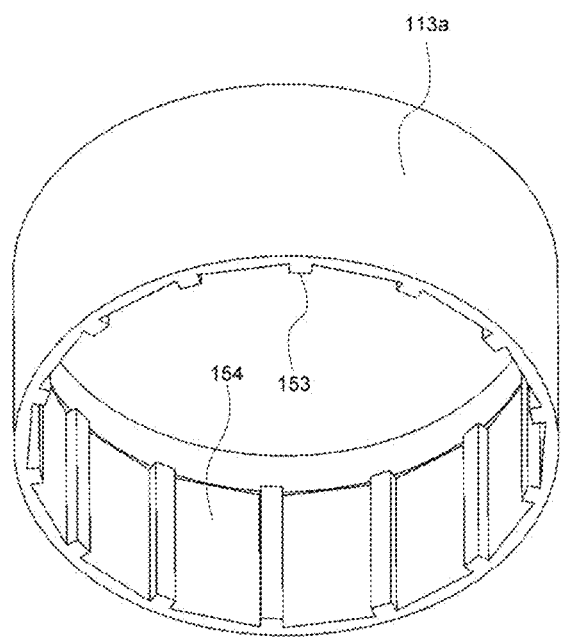
FIG. 16 is a perspective view showing a rotor tube portion.

FIG. 16 is a perspective view showing the rotor tube portion 113a as viewed from below. On the inner face of the rotor tube portion 113a, projections 153 protruding radially inward are provided at predetermined intervals in the circumferential direction. A recess portion 154 is formed between the projections 153. The rotor magnet 125 is disposed in the recess portion 154. The projection 153 positions the rotor magnet 125.

Figure 17:
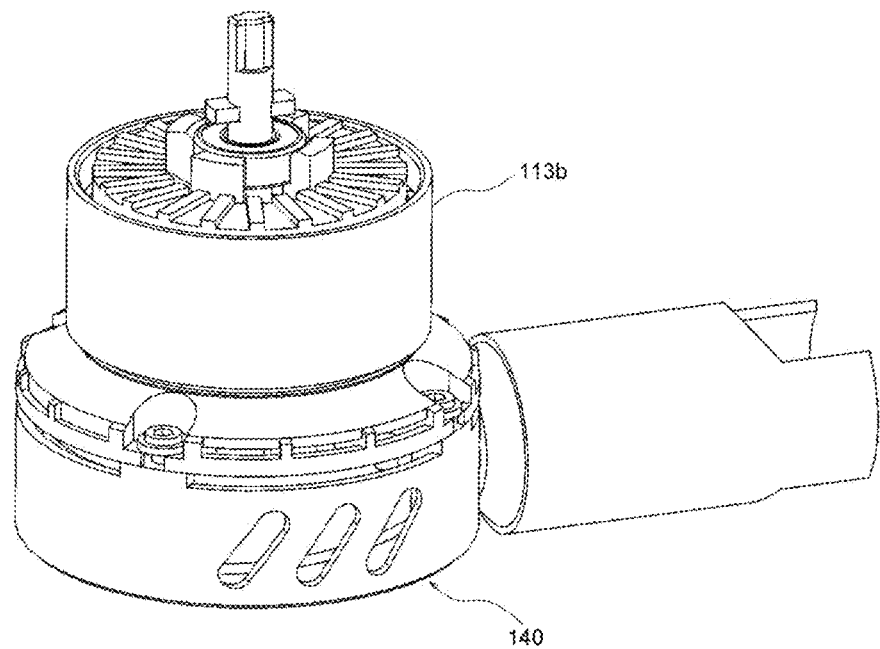
FIG. 17 shows a state where the rotor lid is removed from the state of FIG. 12.
Figure 18:
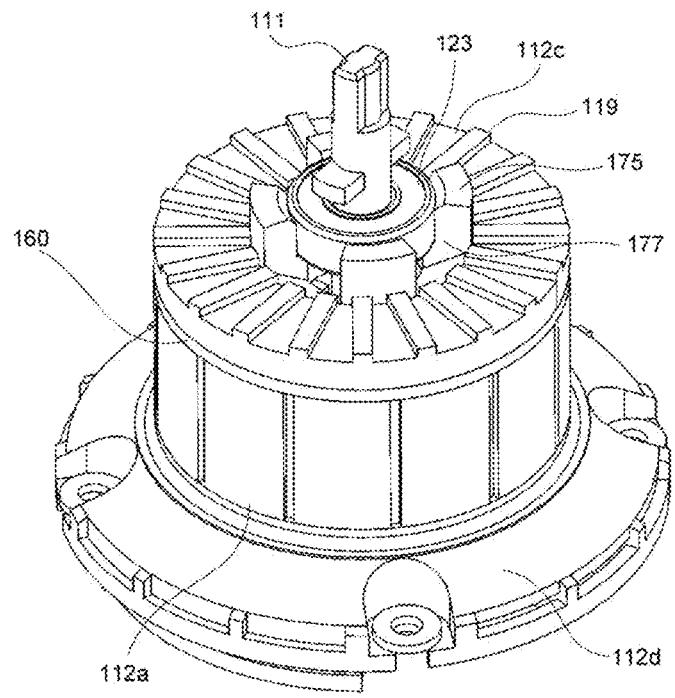
FIG. 18 shows a state where the rotor tube portion and the motor base portion are removed from FIG. 17.

FIG. 17 shows a state where the rotor lid 113b is removed from the state of FIG. 12. FIG. 18 shows a state where the rotor tube portion 113a and the motor base portion 140 are removed from FIG. 17. As shown in FIGS. 13 and 18, the housing member 112 includes a housing outer portion 112a, the housing upper portion 112c that supports the shaft 111 via a first bearing 123, a cylindrical shape portion 112f surrounding the shaft, and the housing lower portion 112d.

Figure 19:
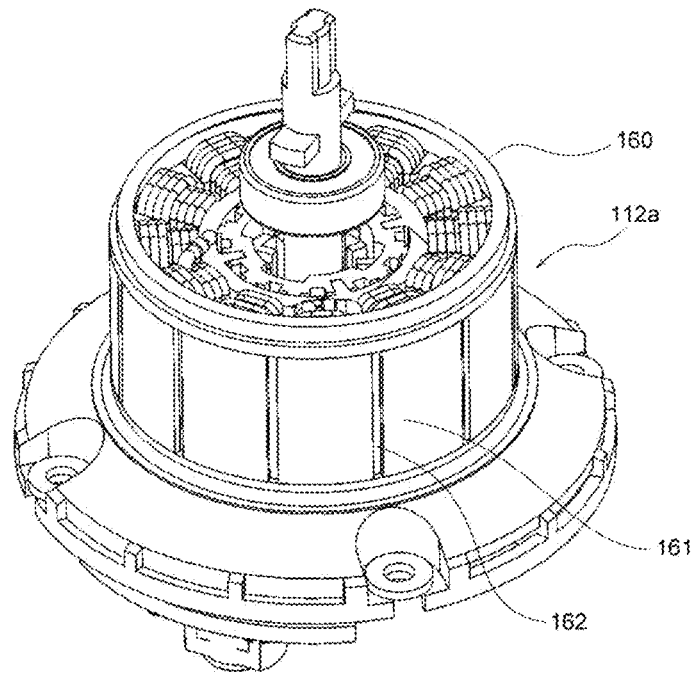
FIG. 19 shows a state where the housing upper portion is removed from FIG. 18.

FIG. 19 shows a state where the housing upper portion 112c is removed from FIG. 18. As shown in FIG. 19, the housing outer portion 112a includes an upper ring portion 160, an umbrella portion 161, and a seal member 162.

Figure 20:
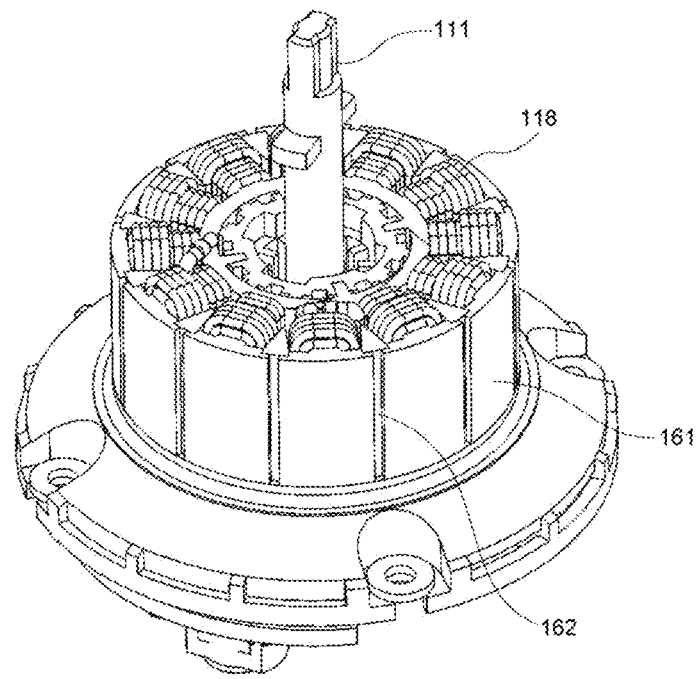
FIG. 20 shows a state where the upper ring portion is removed from the state shown in FIG. 19.
Figure 21:
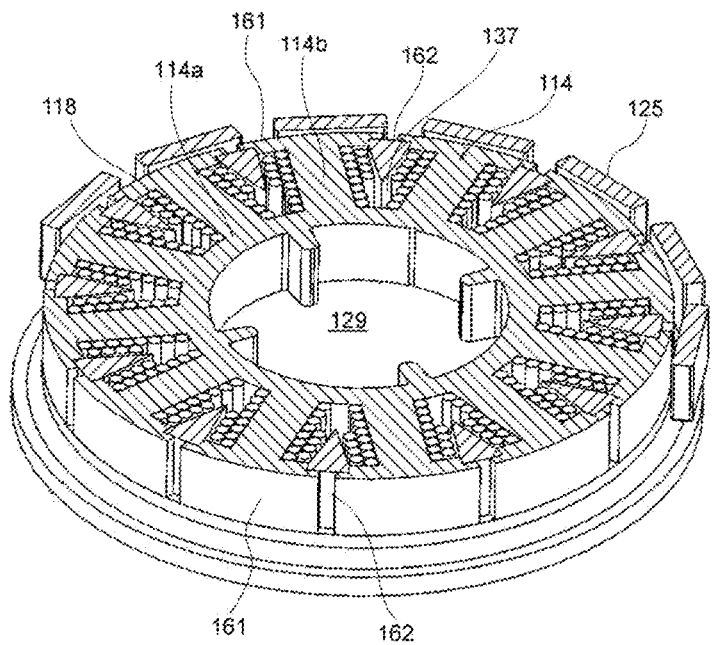
FIG. 21 is a perspective view of a horizontal sectional view taken along line XXI-XXI in FIG. 14.
Figure 22:
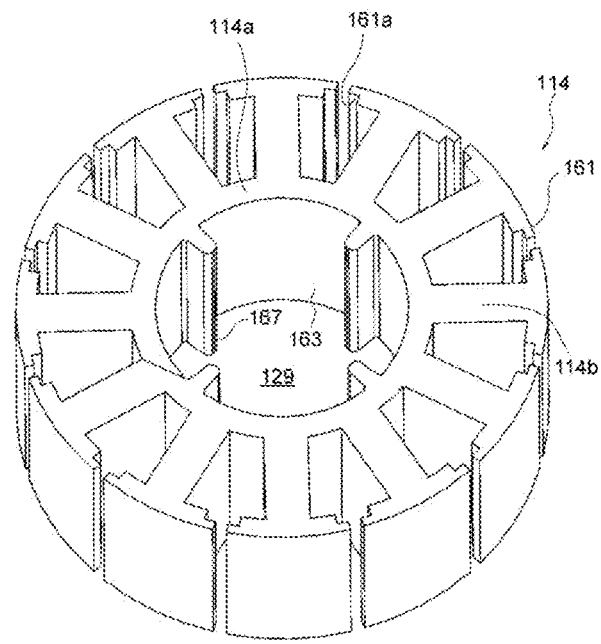
FIG. 22 is a perspective view of a stator.

FIG. 20 shows a state where the first bearing 123 and the upper ring portion 160 are removed from the state of FIG. 19. FIG. 21 is a horizontal sectional view taken along line XXI-XXI in FIG. 14. FIG. 22 is a diagram showing only the stator 114. In FIG. 21, only seven rotor magnets 125 are shown (actually, there are 14 rotor magnets 125). In FIG. 22, a coil 118 wound around a tooth portion 114b is omitted.

As shown in FIGS. 20 to 22, the stator 114 includes a cylindrical core back portion 114a, a plurality of tooth portions 114b extending radially outward from the core back portion 114a, and the umbrella portion 161 circumferentially extending from the distal end of each of the tooth portions 114b. An inner peripheral face 163 of the core back portion 114a is annular. Four protrusions 167 protruding radially inward are provided on the core back inner peripheral face 163. The core back portion 114a is concentric with the shaft 111 and has a central hole 129 in the axial direction. The tooth portion 114b extends radially outward from the outer peripheral face of the core back portion 114a. The seal member 162 is disposed between the adjacent umbrella portions 161. The umbrella portion 161, the seal member 162, and the upper ring portion 160 constitute the housing outer portion 112a. In the present embodiment, twelve tooth portions 114b are arranged at equal intervals in the circumferential direction of the core back portion 114a. The coil 118 is wound around each tooth portion 114b via a predetermined insulator (not shown). The coil 118 excites the stator 114. The housing outer portion 112a surrounds the tooth portion 114b around which the coil 118 is wound of the stator 114. As can be seen from FIG. 19, the stator 114 is accommodated in the housing member 112.

As shown in FIGS. 20 to 22, the shape of each umbrella portion 161 is a rectangular curved plate, and has a curved surface parallel to the peripheral face of the rotor tube portion 113a (FIG. 16). An umbrella cutout portion 161a is provided on the radially inner face of the umbrella portion 161. Each seal portion 162b (FIG. 26) of the seal member 162 is disposed in two adjacent umbrella cutout portions 161a.

As shown in FIG. 13, FIGS. 18 to 20, and FIG. 23, the housing member 112 includes the cylindrical housing outer portion 112a centered on the center axis J, a cylindrically-shaped portion 112f having a smaller diameter than the housing outer portion 112a, the annular housing upper portion 112c that connects the housing outer portion 112a and the cylindrically-shaped portion 112f on the upper side, and the annular housing lower portion 112d that connects the housing outer portion 112a and the cylindrically-shaped portion 112f on the lower side. The housing lower portion 112d is located below the stator 114. The cylindrically-shaped portion 112f has a substantially cylindrical shape that extends axially upward from the inner peripheral face of the housing lower portion 112d. In the present embodiment, the housing lower portion 112d and the cylindrically-shaped portion 112f are integrated. The space defined by the housing outer portion 112a, the cylindrically-shaped portion 112f, the housing upper portion 112c, and the housing lower portion 112d is referred to as the hollow interior of the housing member. The housing member 112 is made of, for example, metal or resin. In the case of metal, an insulating paint is applied to a predetermined portion of the inner surface of the housing member 112. The stator 114 is provided in the hollow interior of the housing member 112. The interior of the housing member 112 is filled with the cooling medium CM. The cooling medium CM is liquid at room temperature, and the coil 118 is immersed in the cooling medium CM in the interior of the housing member 112. Since the coil 118 generates heat while the motor 110 is driven, it may be referred to as a heating element in the following description. The coil 118 is provided so as to contact the umbrella portion 161 that is the radially inner face of the housing outer portion 112a. According to this configuration, since the clearance between the coil 118 and the rotor magnet 125 can be further reduced, it is easy to improve torque performance.

Figure 23:
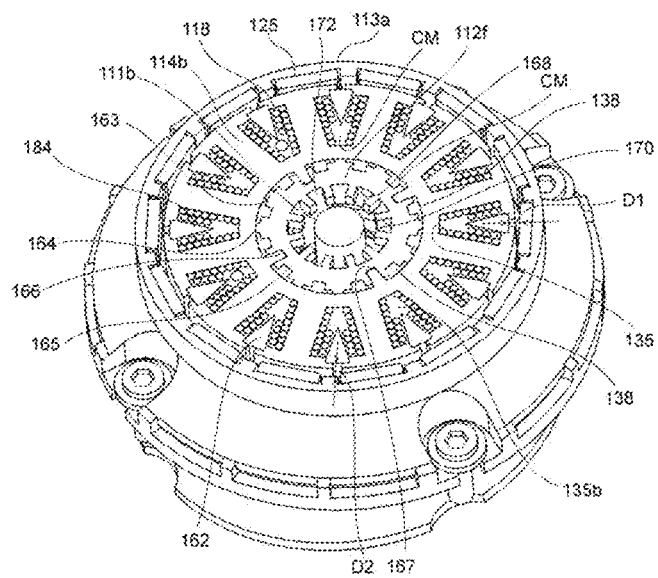
FIG. 23 is a diagram similar to FIG. 21, and shows a cylindrical shape portion, a rotor tube portion, and a rotor magnet.

FIG. 23 is a horizontal sectional view similar to FIG. 21, but also shows the cylindrical shape portion 112f, the rotor tube portion 113a, and the rotor magnet 125. Since the tooth portions 114b around each of which the coil 118 is wound are arranged at intervals in the circumferential direction, a clearance is formed between adjacent tooth portions 114b. This clearance is a cooling chamber 135 through which the cooling medium CM passes. That is, the cooling chamber 135 includes a second cooling chamber 135b described later.

As shown in FIG. 23, the cylindrical shape portion 112f is located on the radially inside of the central hole 129 of the core back portion 114a. The cylindrical shape portion 112f has a cylindrical shape portion outer peripheral face 164 that contacts the core back inner peripheral face 163 of the core back portion 114a, and twelve first outer peripheral recesses 165 that are recessed radially inward are provided on the cylindrical shape portion outer peripheral face 164. The first outer peripheral recess 165 has a projection shape when viewed from the axial direction. A space (a projection space in plan view) provided between the first outer peripheral recesses 165 and the core back inner peripheral face 163 has a configuration of a connection path 138 through which the cooling medium CM passes. The connection path 138 is a cooling medium passage having the same role as the second connection path 38 of the first embodiment. That is, the core back portion 114a and the housing member 112 face each other with a clearance in the radial direction.

Four second outer peripheral recesses 166 that are recessed inward in the radial direction are provided on the cylindrical shape portion outer peripheral face 164. The shape of the second outer peripheral recess 166 is substantially rectangular when viewed from the axial direction. The second outer peripheral recess 166 is recessed radially inward of the first outer peripheral recess 165. Four protrusions 167 protruding radially inward from the core back inner peripheral face 163 are inserted into the four second outer peripheral recesses 166, respectively.

As shown in FIG. 23, the cylindrical shape portion 112f surrounds the shaft 111. The cylindrical shape portion 112f has a cylindrical shape portion inner peripheral face 168 that is spaced apart from the shaft 111 by a predetermined distance in the radial direction and surrounds the shaft 111. Heat radiation fins 170 protruding radially inward are provided on the cylindrical shape portion inner peripheral face 168. A plurality of the heat radiation fins 170 is provided at predetermined intervals in the circumferential direction. An inner space 172 located radially inside the cylindrical shape portion 112f is provided between the outer peripheral face 111b of the shaft 111 and the cylindrical shape portion inner peripheral face 168. The inner space 172 extends in the axial direction. The inner space 172 is an air passage through which outside air from the rotor opening 151 flows.

Figure 24:
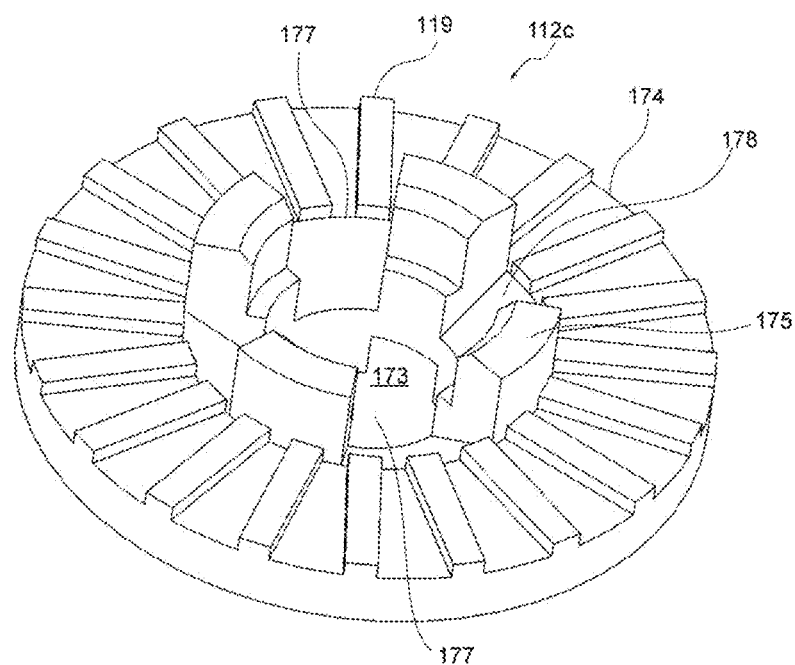
FIG. 24 is a perspective view showing the housing upper portion.

FIG. 24 is a diagram showing only the housing upper portion 112c. As shown in FIG. 24, the housing upper portion 112c includes a flat plate annular portion 174 having a central opening 173 that is an opening penetrating in the axial direction, a bearing holder portion 175 extending from the inner periphery of the central opening 173, and a heat sink 119 provided on the upper face of the flat plate annular portion 174. The flat plate annular portion 174 has a flat plate shape and a ring shape. In the present embodiment, a plurality of heat sinks 119 extends radially outward of the central opening 173. The heat sink 119 makes it easy to release the heat in the interior of the housing member 112 to the outside.

The four bearing holder portions 175 are provided at equal intervals in the circumferential direction, and a duct 177 is provided between adjacent bearing holder portions. The first bearing 123 is held by the bearing holder portion 175. The duct 117 is an opening provided between the first bearing 123 and the flat plate annular portion 174 in the axial direction. A second bearing 124 located below the first bearing 123 is, as shown in FIG. 14, located on the motor base portion 140. The shaft 111 is rotatably supported around the center axis J by the first bearing 123 and the second bearing 124.

When the first bearing 123 is held by the bearing holder portion 175, the upper side of the clearance between adjacent bearing holder portions is closed, and is the duct 177 through which air passes. The air inlet of the duct 177 is located on the radially outside of the first bearing 123. The inner peripheral portion of the flat plate annular portion 174 between adjacent bearing holders has a slope 178 inclined axially downward and radially inward. Therefore, the duct 177 is inclined downward inward in the radial direction and extends toward the shaft 111. The rotor opening 151 communicates with the duct 177. The duct 177 communicates with an air passage 172. With this configuration, the air that has passed through the rotor opening 151 and entered the rotor 113 smoothly flows into the air passage 172.

Figure 25:
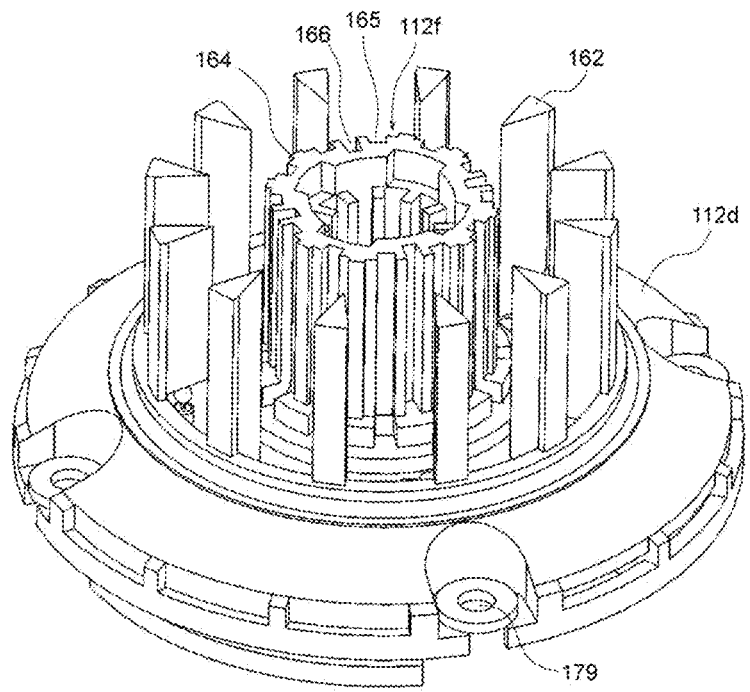
FIG. 25 is a perspective view showing a housing lower portion, a cylindrical shape portion, and a seal member.
Figure 26:
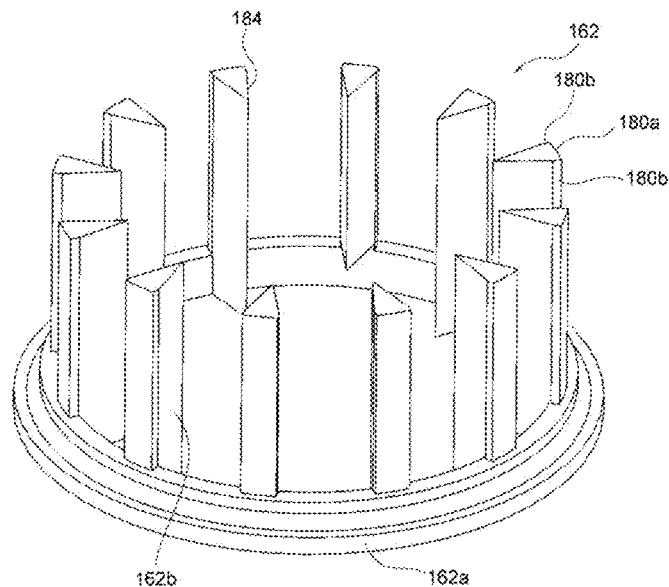
FIG. 26 is a perspective view showing a seal member.

FIG. 25 is a diagram showing the housing lower portion 112d, the cylindrical shape portion 112f, and the seal member 162. FIG. 26 shows only the seal member 162. The seal member 162 includes an annular ring portion 162a and the seal portion 162b axially extending in the direction from the ring portion 162a. The seal portions 162b are provided at predetermined intervals in the circumferential direction of the ring portion 162a. The ring portion 162a contacts the upper face of the housing lower portion 112d in the axial direction. For example, the ring portion 162a is fixed to the upper face of the housing lower portion 112d in the axial direction using an adhesive. In this case, for example, an adhesive is applied to the lower face of the ring portion 162a, and the lower face of the ring portion 162a is attached to the upper face of the housing lower portion 112d in the axial direction.

Each seal portion 162b is a pentagon when viewed from the axial direction. As can be seen from FIGS. 22, 23 and 26, a pentagonal bottom side 180a and two sides 180b extending from both ends of the bottom side of each seal portion 162b are inserted into the umbrella cutout portion 161a, and the remaining two sides 180c protrude radially inward of the umbrella cutout portion 161a. The protruding portion is a seal extension portion 184 located between adjacent coils 118. Since the seal extension portion 184 is located between the adjacent coils 118, when the coil 118 generates heat, the heat propagates through the extension portion 184, is guided radially outward, and discharged to the outside of the stator 114. Compared to the case where there is no extension portion 184, when there is the extension portion 184, the heat transfer area can be increased, so that the heat radiation performance of the motor 110 is improved.

As shown in FIG. 25, four lower holes 179 are provided on the outer periphery of the housing lower portion 112d. When attaching the housing lower portion 112d to the motor base portion 140, the mounting bolt is inserted into the lower hole 179, and is screwed into a female screw portion (not shown) of the motor base portion 140.

Figure 27:
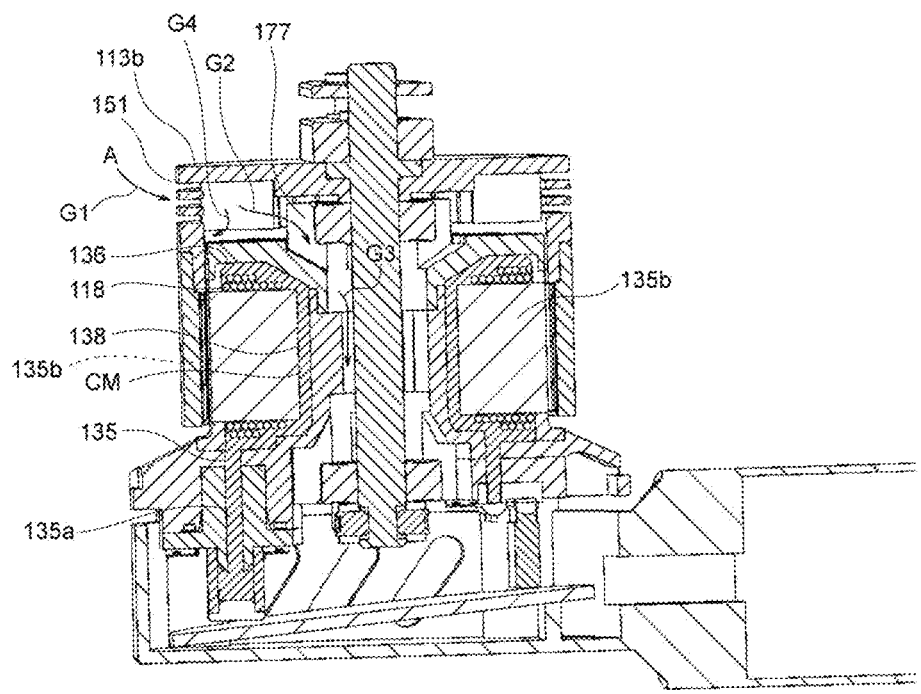
FIG. 27 is a diagram similar to FIG. 21, and illustrating the flow of a cooling medium CM and air.

Although FIG. 27 is the same vertical sectional view as FIG. 14, it shows the flow of air A and the cooling medium CM in the motor 110 of the present embodiment. When the rotor 113 rotates, as shown by the arrow G1, the air A enters the inside of the rotor lid 113b through the rotor openings 151 of the rotor lid 113b. Thereafter, part of the air A passes through the duct 177 toward the shaft 111 as indicated by the arrow G2. Part of the air A reaches the shaft 111 and flows downward along the shaft 111 in the axial direction as indicated by the arrow G3. Also, as shown by the arrow G4, the other part of air A heads radially outward, and passes between the outer periphery of the stator 114 (the outer periphery of the umbrella portion 161) and the rotor tube portion 113*a*. That is, the air indicated by the arrow G4 flows between the tube portion 113*a* of the rotor 113 and an outer portion 112*a* of the housing member 112. Thus, in particular, the cylindrical shape portion 112*f* and the shaft 111 are cooled by the air of the arrow G3, and the outer peripheral portion of the motor 110 is cooled by the air indicated by the arrow G4.

The cooling medium CM is indicated by hatching in FIG. 27. The stator 114 is located in the interior of the housing member 112, and in the interior of the housing member 112, the space other than the stator 114 is defined by the cooling chamber 135, a heat releasing chamber 136, and the connection path 138. The cooling chamber 135, the heat releasing chamber 136, and the connection path 138 are filled with the cooling medium CM.

The cooling chamber 135 is provided so as to accommodate the coil 118 from the lower side of the interior of the housing member. More specifically, the cooling chamber 135 includes a space provided in the lower portion 112*d* of the housing member 112 (an elongated space 135*a* extending downward of the stator in FIG. 27), a space surrounding the lower end of the coil 118 from the upper end of the space, a space provided between the tooth portions 114*b*, and a space surrounding the upper end of the coil 118. The heat releasing chamber 136 is provided above the cooling chamber 135 in the interior of the housing member. The heat releasing chamber 136 extends radially inward along the inner (lower) face of a housing upper portion 122*c*. The connection path 138 extends downward along the cylindrical shape portion 112*f* of the housing member 112 from the radially inner end of the heat releasing chamber 136, and connects the cooling chamber 135 and the heat releasing chamber 136. The lower side end portion of the connection path 138 in the vertical direction is connected to the inlet side end portion of the upper side of the cooling chamber 135 in the vertical direction.

The cooling chamber 135 cools the coil 118 that is a heating element. The cooling chamber 135 includes a first cooling chamber 135*a* that is a space below the stator 114, and the second cooling chamber 135*b* formed above the first cooling chamber 135*a* and surrounding the stator 114 and the coil 118. In the present embodiment, the coil 118 is located in the second cooling chamber 135*b*. The first cooling chamber 135*a* and the second cooling chamber 135*b* are continuous, and the cooling chamber 135 is constituted by the two cooling chambers. The coil 18 that is a heating element is accommodated in the cooling chamber 135.

A plurality of the tooth portions 114*b* of the stator 114 and the coil 118 are positioned in the second cooling chamber 135*b*. The cooling medium CM flows from the first cooling chamber 135*a* to the second cooling chamber 135*b*. When the cooling medium CM passes through the second cooling chamber 135*b*, it flows through the clearance between the plurality of tooth portions 114*b* of the stator 114 and the coil 118. In the present embodiment, since the cooling chamber 135 is connected to the heat releasing chamber 136, there is no first connection path of the first embodiment.

The heat releasing chamber 136 is formed under the housing upper portion 112*c*. The heat releasing chamber 136 releases the heat of the cooling medium CM to the outside. The heat releasing chamber 136 is an annular space. The heat sink 119 is provided above the heat releasing chamber 136 in the vertical direction. The heat sink 119 is an example of a heat absorbing unit. The heat sink 119 absorbs heat from the cooling medium CM in the heat releasing chamber 136. The configuration of the heat absorbing unit is not limited to the heat sink as long as heat can be absorbed from the cooling medium CM in the heat releasing chamber 136. The heat sink 119 is made of a member having a relatively high thermal conductivity, for example. The fins 152 provided on the lower side of the rotor lid 113*b* cause a negative pressure between the rotor lid 113*b* and the housing upper portion 112*c* when the rotor 113 rotates, this negative pressure generates airflow (G2, G4), and the housing upper portion 112*c* is cooled (the air can be blown into the heat releasing chamber 136). Therefore, the fins 152 formed on the rotor lid 113*b* also promote the heat radiation from the heat releasing chamber 136.

The connection path 138 extends axially downward from the heat releasing chamber 136 along the cylindrical shape portion 112*f* to reach the cooling chamber 135.

The circulation of the cooling medium CM and the cooling of the heating element in the present embodiment is almost the same as those in the first embodiment except that there is no first connection path 37. The cooling medium CM heated by the coil 118 ascends in the cooling chamber 135 and reaches the heat releasing chamber 136. The cooling medium CM releases heat in the heat releasing chamber 136, moves downward through the connection path 136, and reaches the cooling chamber 135.

In this embodiment, the rotor opening 151 for introducing air into the motor is provided in the rotor 113, the duct 177 communicating with the rotor opening 151 is provided in the housing upper portion 112*c*, and a space (air passage) 172 communicating with the duct 177 is provided in the cylindrical shape portion 112*f* around the shaft 111, so that air flowing from the rotor opening 151 flows into the air passage 172 through the duct 177. Therefore, wind flows around the shaft 111 inside the motor 110. Since the interior of the motor 110 is cooled by the flow of this wind, heat does not easily accumulate in the interior of the motor 110.

Also, as shown in FIG. 23, since the seal member 162 is disposed in the umbrella cutout portion 161*a*, a predetermined distance D1 can be secured between the bottom side 180*a* of a seal portion 162*a* and the rotor magnet 125, and a predetermined distance D2 can be secured between the bottom side 180*a* of the seal portion 162*a* and the rotor projection 153. Therefore, even when the seal portion 162*a* expands radially outward due to heat, the bottom side 180*a* of the seal portion 162*a* does not contact the rotor magnet 125, or the rotor projection 153. Further, the radial clearance (air gap) between the rotor magnet 125 and the umbrella portion 161 (stator 114) can be reduced.

Figure 28:
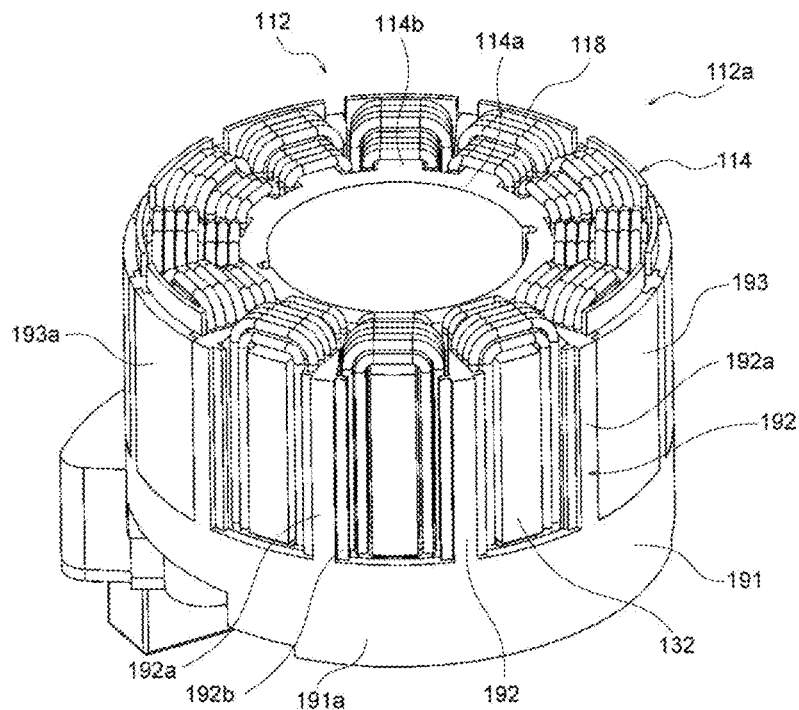
FIG. 28 is a perspective view showing a modification of the second embodiment.
Figure 29:
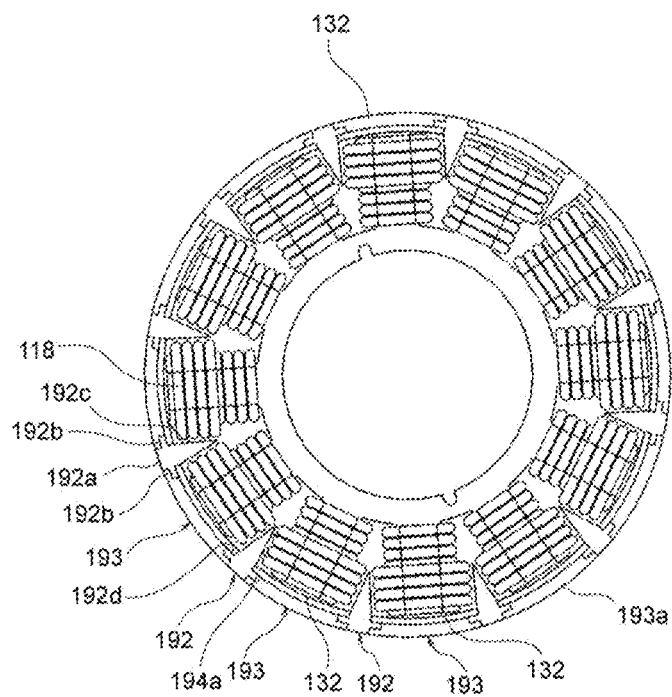
FIG. 29 is a plan view of FIG. 28.
Figure 30:
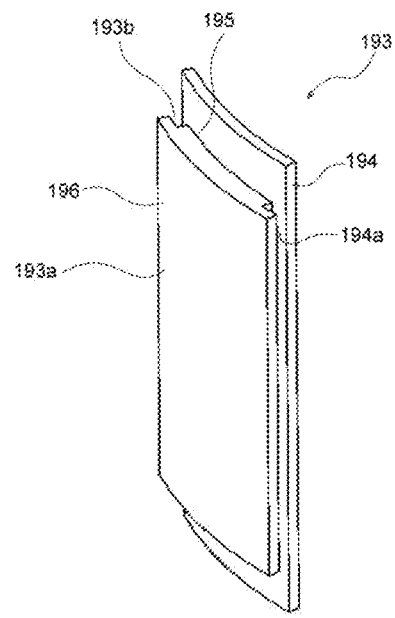
FIG. 30 is a perspective view of a plate-like member.

Next, a modification of the second embodiment will be described. FIGS. 28 to 30 show the housing member 112 and the stator 114 according to the modification. FIG. 28 is a perspective view, FIG. 29 is a plan view, and FIG. 30 is a perspective view of a plate-like member 193 (described later). As can be seen by comparing the second embodiment (FIGS. 20 to 23) and FIG. 28, in the modification, the stator 114 does not have the umbrella portion 161. That is, as in the first embodiment, the stator 114 includes the annular core back portion 114*a*, a plurality of the tooth portions 114*b* extending radially outward from the core back portion 114*a*, the coil 118 is wound around each tooth portion 114*b*, and the distal end portion end face 132 of each tooth portion 114*b* is exposed outward in the radial direction. FIG. 28 shows a state where three plate-like members 193 are removed in order to facilitate understanding of the structure of the modification (so that the distal end portion end face 132 of can be seen).

A housing member 114 of the modification is different from the housing member of the second embodiment in the structure of the housing outer portion 112a. The housing outer portion 112a surrounding the stator 114 of the modification includes an annular lower annular portion 191, a plurality of columnar portions 192 extending axially upward from the lower annular portion 191, and a plurality of the plate-like members 193 provided between each of the plurality of columnar portions 192. The columnar portions 192 are provided at predetermined intervals in the circumferential direction. Each columnar portion 192 has a columnar shape. The number of the plate-like members 193 is equal to the number of tooth portions 114b. Although not shown, the housing member 112 has a housing upper portion that supports the shaft 111 as in the second embodiment. The housing upper portion is provided so as to cover the upper side of the housing outer portion 112a shown in FIG. 28. The lower annular portion 191 and the columnar portion 192 are integrally formed and may be referred to as a core socket. Further, the plate-like member 193 may be referred to as a seal core. The plate-like member 193 is made of, for example, an iron bulk material.

As shown in FIG. 29, the radially inner faces (inner peripheral faces) of the plurality of the plate-like members 193 are in contact with the distal end portion end portions 132 of the plurality of tooth portions, respectively. Further, the plurality of columnar portions 192 is located between the plurality of the plate-like members 193. A face (outer peripheral face) 193a located radially outside of the plate-like member 193 has the same diameter as a face (outer peripheral face) 191a located radially outside of the lower annular portion 191 (FIG. 28). Further, a face (outer peripheral face) 192a located radially outside of the columnar portion 192 has the same diameter as the outer peripheral face 191a of the lower annular portion 191. Since the housing outer portion 112a is closed by the lower annular portion 191, the columnar portion 192, and the plate-like member 193, so that the cooling medium CM does not leak from the housing outer portion 112a. Since the lower annular portion 191, the columnar portion 192 and the plate-like member 193 have the same diameter, so that without increasing the outer diameter of the housing member 112, the cooling medium CM can be prevented from leaking.

As shown in FIGS. 28 to 30, the columnar portion 192 has a columnar engagement portion 192b at a position radially inward of the outer peripheral face 192a. The columnar engagement portions 192b are projections protruding in the circumferential direction, and the columnar engagement portions 192b are provided on both sides of each columnar portion 192. The plate-like member 193 has a plate-like member engagement portion 193b on the end face in the circumferential direction (end faces on both sides). The plate-like member engagement portion 193b is a recess that is recessed in the circumferential direction. As shown in FIG. 30, each plate-like member 193 has a shape in which three plate portions 194, 195, and 196 having different sizes are stacked from the inner side to the outer side in the radial direction. The plate portion 194 on the radially inner side is the largest plate portion, and the central plate portion 195 connected to the plate portion 194 is the smallest plate portion. The outer plate portion 196 connected to the central plate portion 195 has the same height as the plate portion 195, but the width (size in the circumferential direction) is larger than that of the plate portion 195. The widths of the plate portion 194 and the plate portion 196 are the same. Since the plate portion 195 having a small width is located between the plate portion 194 and the plate portion 196, a recessed portion that is recessed in the circumferential direction is provided at the position of the plate portion 195. The recessed portion is represented by the plate-like member engagement portion 193b. The plate portion 194 is an inner peripheral portion of the plate-like member 193. The axial dimensions of the plate portions 195 and 196 are the same. The axial dimension of the plate portion 194 is larger than that of the plate portions 195 and 196.

When one plate-like member 193 is inserted between two adjacent columnar portions 192, the engagement portions (recesses) 193b on both sides of the plate-like member 193 engage with the engagement portions (projections) 192b of the adjacent columnar portions 192. More specifically, the columnar portion 192 has a columnar engagement face 192d having a smaller diameter than an outer peripheral face 192a. The plate portion 194 of the plate-like member 193 has a plate-like engagement face 194a that contacts the columnar engagement face 192d in the radial direction. When one plate-like member 193 is inserted between two adjacent columnar portions 192, the columnar engagement face 192d and the plate-like engagement face 194a contact each other, so that one plate-like member 193 is held between the two columnar portions 192. For example, an adhesive is applied to the columnar engagement face 192d and/or the plate-like engagement face 194a, and the plate-like member 193 and the columnar portion 192 are joined by an adhesive.

The columnar portion 192 has an extension portion 192c extending radially inward of the housing member 112. The extension portion 192c is located between the adjacent coils 118. Since the extension portion 192c is located between the coils 118, when the coil 118 generates heat, the heat propagates through the extension portion 192c, and is guided radially outward and discharged to the outside of the stator 114. Compared to the case where there is no extension portion 192c, when there is the extension portion 192c, the heat transfer area can be increased, so that the heat radiation performance of the motor 110 is improved.

Note that the housing upper portion 112c of the second embodiment may be provided with a component similar to the pressure adjustment element 21 of the first embodiment. When the cooling medium CM is vaporized to form bubbles and the pressure inside the housing increases, the pressure adjustment element is opened.

Also in the second embodiment, the first connection path extending upward from the cooling chamber 135 may be provided, and the upper end of the first connection path may be connected to the heat releasing chamber 136. In this case, a member such as the first annular member 15 is provided on the stator 114, for example.

In the first embodiment and the second embodiment described above, the heat sinks 19 and 119 are provided on the housing upper portions 12c and 112c, but a plurality of protuberances whose shape is different from the shape of the illustrated heat sinks 19 and 119 may be provided on the housing upper portions 12c and 112c. The plurality of protuberances extends in the axial direction.

The housing upper portion 112c of the second embodiment is composed of one member, but may be composed of two members. When the housing upper portion 112c is composed of two members, for example, the bearing holder portion 175 of FIG. 18 is an independent member.

The ring portion 162a does not have to be a complete ring. For example, the ring portion 162a may be C-shaped.

The seal portion 162b (FIG. 26) may be made of an elastic material (for example, a rubber material). When the seal portion 162b has elasticity, the seal portion 162b can have an internal pressure adjustment function in addition to the sealing function. More specifically, when the internal pressure of the motor (liquid pressure and vapor pressure of the cooling medium) increases, the seal portion 162b is elastically contracted by the pressure. The elastic contraction can mitigate an increase in the pressure of the cooling medium, and the internal pressure of the motor can be adjusted. When the seal portion 162b has an internal pressure adjustment function, there is no need to separately provide internal pressure adjustment components (e.g., a diaphragm for absorbing pressure rise, and a fixing cover and screws for holding the diaphragm). As a result, the number of components of the motor 110 is reduced, and the component cost of the motor 110 is reduced. In addition, the weight of the motor 110 is reduced.

Figure 31A:
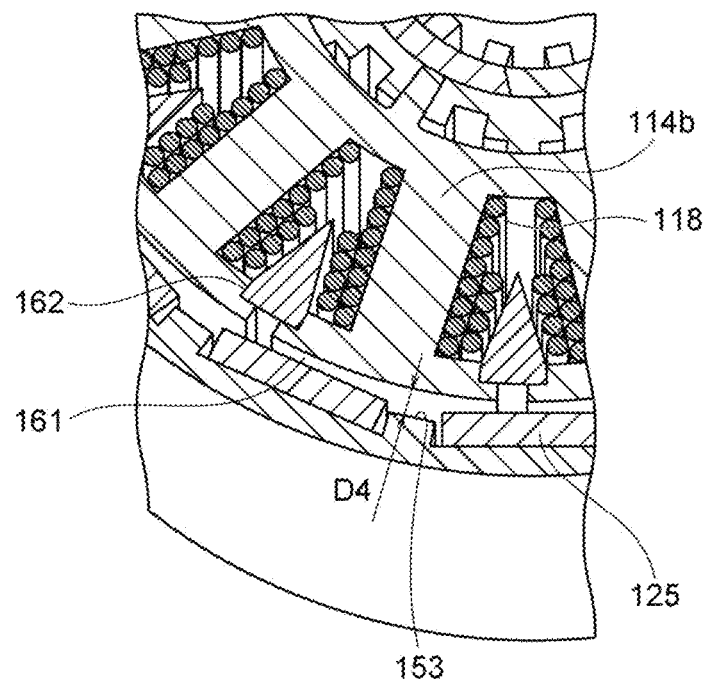
FIG. 31A is a partially enlarged view of FIG. 23.
Figure 31B:
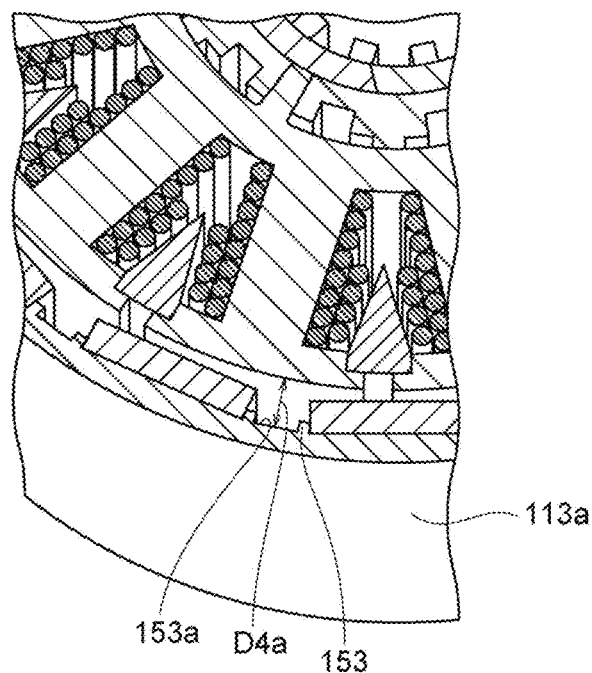
FIG. 31B is a diagram showing a modification of the configuration shown in FIG. 31A.

FIG. 31A is a partially enlarged view of FIG. 23, and the rotor tube portion 113a, the rotor projection 153, the rotor magnet 125, the umbrella portion 161, the coil 118, the tooth portion 114b, the seal member 162, and the like are shown. In FIG. 31A, the distance between the rotor projection 153 and the umbrella portion 161 is indicated by reference sign D4. The distance D4 between the rotor projection 153 and the umbrella portion 161 of the present embodiment is not limited to that shown in FIG. 31A. For example, as shown in FIG. 31B, it may be a distance D4a larger than the distance D4. In the modification shown in FIG. 31B, a groove 153a is provided in the rotor projection 153. The groove 153a is a groove recessed outward in the radial direction.

When the groove 153a is provided in the rotor projection 153, a clearance between the rotor projection 153 and the umbrella portion 161 is increased at the location where the groove 153a exists. That is, an air gap (a clearance through which air can pass) between the inner peripheral face of the rotor 113 and the outer peripheral face of the stator is increased. The groove 153a is a ventilation groove, and the amount of air (wind volume) passing through the air gap between the inner peripheral face of the rotor 113 and the outer peripheral face of the stator is increased by the groove 153a. Therefore, the air flow (wind volume) generated by the rotation of the fins 152 of the rotor lid 113b increases between the rotor projection 153 and the umbrella portion 161. The increase in the wind volume increases the ventilation inside the rotor, so that the heat radiation due to the ventilation also increases.

The groove 153a extends in the axial direction of the rotor. The cross-sectional shape of the groove 153a (the cross-section when viewed in the axial direction of the motor) is rectangular in FIG. 31B, but it may have a cross-sectional shape other than a rectangle (for example, a semicircle that is recessed outward in the radial direction). The depth, width, curvature radius, shape, and the like of the groove 153a are determined in consideration of the strength of the rotor tube portion 113a.

Figure 32A:
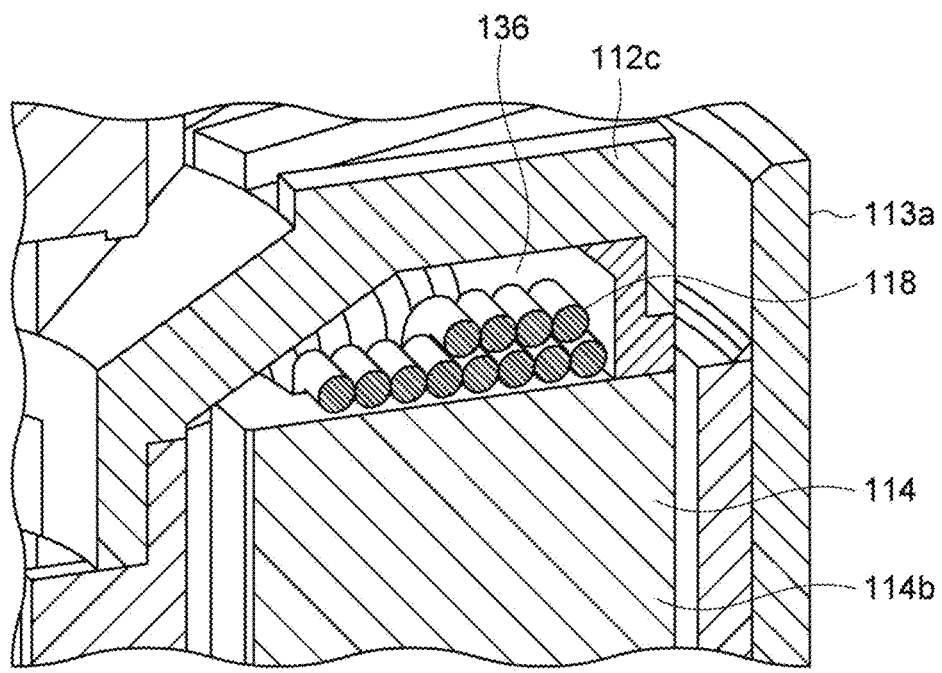
FIG. 32A is a partially enlarged view of FIG. 13.
Figure 32B:
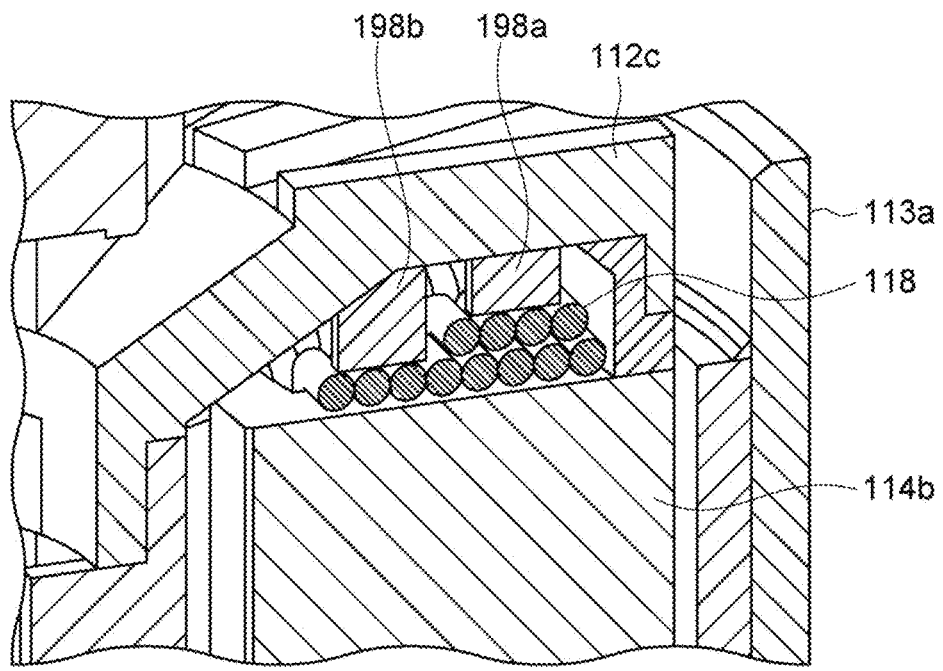
FIG. 32B is a diagram showing a modification of the configuration shown in FIG. 32A.

FIG. 32A is a partially enlarged view of FIG. 13, and the rotor tube portion 113a, the housing upper portion 112c, the stator 114, the tooth portion 114b, the coil 118, and the like are shown. In FIG. 32A, the heat releasing chamber 136 is provided above the coil 118. Nothing is provided between the coil 118 and the housing upper portion 112c. The configuration of the heat releasing chamber 136 of the present embodiment is not limited to that shown in FIG. 32A, and for example, the configuration shown in FIG. 32B may be used. In the modification shown in FIG. 32B, heat transfer members 198a and 198b are provided on the coil 118 located in the heat releasing chamber 136. In FIG. 32B, only one tooth portion 114b and the coil 118 wound around this are depicted, but a similar heat transfer member is provided on a coil wound around another tooth portion.

The heat transfer members 198a and 198b shown in FIG. 32B are columnar members. The lower ends of the heat transfer members 198a and 198b are in contact with the coil 118. The upper ends of the heat transfer members 198a and 198b are in contact with the housing upper portion 112c. That is, the coil 118 is connected to the housing upper portion 112c via the heat transfer members 198a and 198b. Therefore, the heat of the coil 118 is directly transferred to the housing upper portion 112c via the heat transfer members 198a and 198b. Compared to the case where there is no heat transfer member, when the configuration of FIG. 32B is used, the heat of the coil 118 is directly transferred to the housing upper portion 112c via the heat transfer members 198a and 198b, and more heat can be released from the housing upper portion 112c. A high temperature cooling medium flows into the heat releasing chamber 136, and the cooling medium releases the heat. Therefore, it is desirable that heat radiation proceeds smoothly in the heat releasing chamber 136, and the vapor of the cooling medium is quickly liquefied by the heat radiation. According to the configuration of FIG. 32B, the heat radiation from the heat releasing chamber 136 is increased.

The heat transfer members 198a and 198b are made of a highly thermoelectric material. Further, since the heat transfer members 198a and 198b need to have insulation properties, the heat transfer members 198a and 198b are made of a resin material. The heat transfer members 198a and 198b may be made of a metal material having an insulating layer on the surface.

The heat transfer members 198a and 198b have predetermined elasticity. This is because since the heat transfer members 198a and 198b are sandwiched between the coil 118 and the housing upper portion 112c, when they have no elasticity, the coil 118 and/or the housing upper portion may be damaged.

The heat transfer members 198a and 198b are provided in the heat releasing chamber 136. Since the cooling medium flows through the heat releasing chamber 136, the heat transfer members 198a and 198b are set to have a shape and a position that do not greatly disturb the flow of the cooling medium.

The size and shape of the cross section of the heat transfer members 198a and 198b when viewed in the axial direction of the motor is determined in consideration of the amount of heat transfer by the heat transfer member, and the flow of the cooling medium when the heat transfer member is provided.

In FIG. 32B, the two heat transfer members 198a and 198b are provided on the coil 118 wound around each tooth portion 114b, but three or more heat transfer members may be provided as long as the flow of the cooling medium is not significantly hindered (in this case, the cross-sectional size of the heat transfer member is made smaller than that shown in the figure). When the heat transfer by the heat transfer member may be small, the number of heat transfer members may be one.

In FIG. 32B, the cross sections of the heat transfer members 198a and 198b when viewed in the axial direction of the motor are rectangular. The heat transfer members 198a and 198b may have a cross section other than a rectangle. For example, the shape may be a circle, an ellipse, a streamline, or a polygon other than a rectangle (triangle, pentagon, etc.).

According to the configuration of FIG. 32B, since the heat generated from the coil 118 is transmitted to the housing upper portion 112c through the heat transfer members 198a and 198b, the heat transfer members 198a and 198b increase the heat passage in the heat releasing chamber 136, and the heat radiation capability of the motor is improved.

Figure 33:
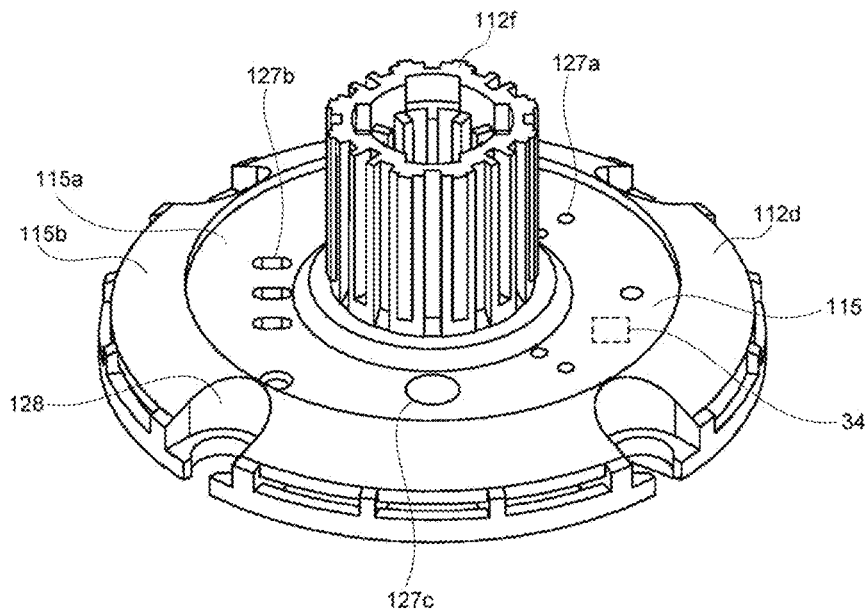
FIG. 33 is a diagram showing a state where the seal member is removed from the state of FIG. 25.
Figure 34:
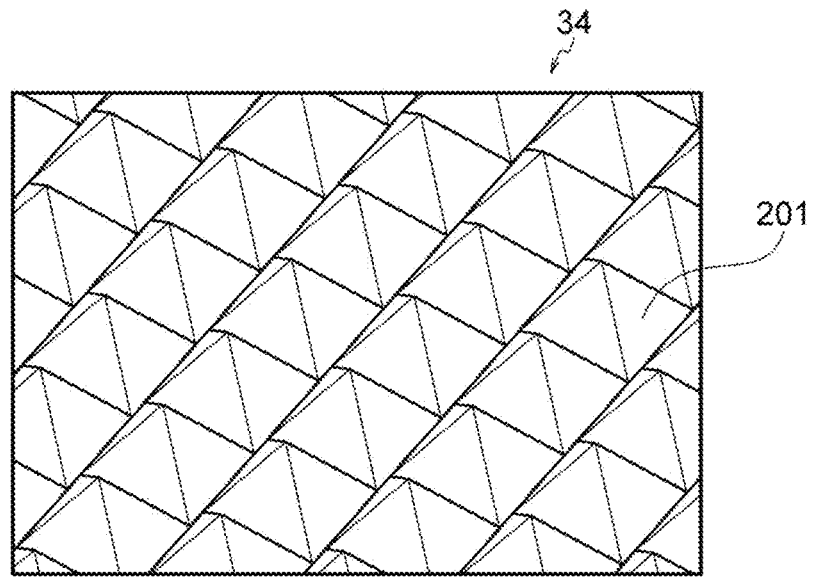
FIG. 34 is a partially enlarged view showing a modification of the configuration shown in FIG. 33.

FIG. 33 shows a state where the seal member 162 (FIG. 26) is removed from the state of FIG. 25. FIG. 33 shows the housing lower portion 112d and the cylindrical shape portion 112f. As shown in FIG. 33, an upper face 115 of the housing lower portion 112d has a radially inner surface 115a located around the cylindrical shape portion 112f, and a radially outer surface 115b located around the radially inner surface 115a. The shape of the radially inner surface 115a is a flat ring, and a plurality of holes 127a, 127b, and 127c is provided at predetermined positions on the radially inner surface 115a. The shape of the radially outer surface 115b is an annular shape that is inclined downward toward the radially outward direction, and the radially outer surface 115b is provided with a plurality of cutout portions 128 and the like. The configuration of the radially inner surface 115a of the housing lower portion 112d of the present embodiment is not limited to a flat surface as shown in FIG. 33. For example, the configuration shown in FIG. 34 may be used. FIG. 34 is an enlarged view of a portion of reference sign 34 in FIG. 33. In the modification shown in FIG. 34, the radially inner surface 115a is not flat.

As shown in FIG. 34, in this modification, the radially inner surface 115a has a plurality of pyramidal projections 201. Each of the pyramidal projections 201 has the bottom side of the quadrangular pyramid. The plurality of pyramidal projections 201 is arranged in a predetermined direction (in the diagonally upper right direction in FIG. 34) without any front/rear/left/right clearances. The pyramidal projections 201 are formed by, for example, milling. By adjusting the angle of the cutter used in milling, the apex angle of each of the pyramidal projections 201 (reference sign θ1 in FIG. 35) can be formed at a desired angle.

Figure 35:
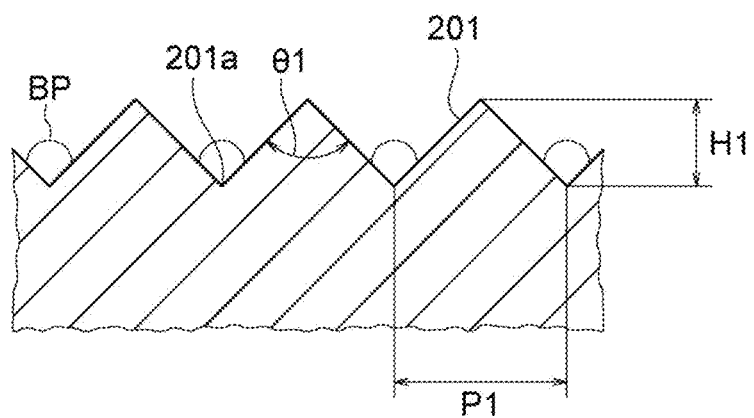
FIG. 35 is a vertical sectional view of a pyramidal projection.

FIG. 35 is a vertical sectional view of the pyramidal projections 201. The apex angle θ1 of each of the pyramidal projections 201 is about 90 degrees in FIG. 35, but a preferable angle is, for example, 30 degrees. The pitch P1 of the pyramidal projection 201 is, for example, 0.5 mm. The height H1 of the pyramidal projections 201 is, for example, 0.93 mm.

When the pyramidal projections 201 are provided on the housing lower portion 112d (radially inner surface 115a), formed vapor bubbles (foaming points) are increased when the cooling medium boils, compared to the case where there is no pyramidal projection 201. In other words, since the valley 201a between the projection and the projection is the generation starting point of the nucleus (bubble nucleus) that grows to the foaming point, and there are many valleys 201a at the housing lower portion, many foaming points are formed when the cooling medium boils.

The radially inner surface 115a of the housing lower portion 112d constitutes part of the cooling chamber 135 for the cooling medium, and is a place where the vapor bubbles (foaming point) are first formed when the coil 118 generates heat and the cooling medium boils. Since vapor bubbles are a medium for transferring heat by latent heat, the amount of heat transfer by latent heat increases as more vapor bubbles are formed. Therefore, it is desirable that many vapor bubbles be formed on the radially inner surface 115a. As shown in FIG. 35, when the pyramidal projections 201 are provided, vapor bubbles BP are likely to be formed at the bottom portion (valley) 201a of the pyramidal projection 201. The pyramidal projection 201 can also be called a vapor bubble (foaming point) formation promoting portion.

Figure 36:
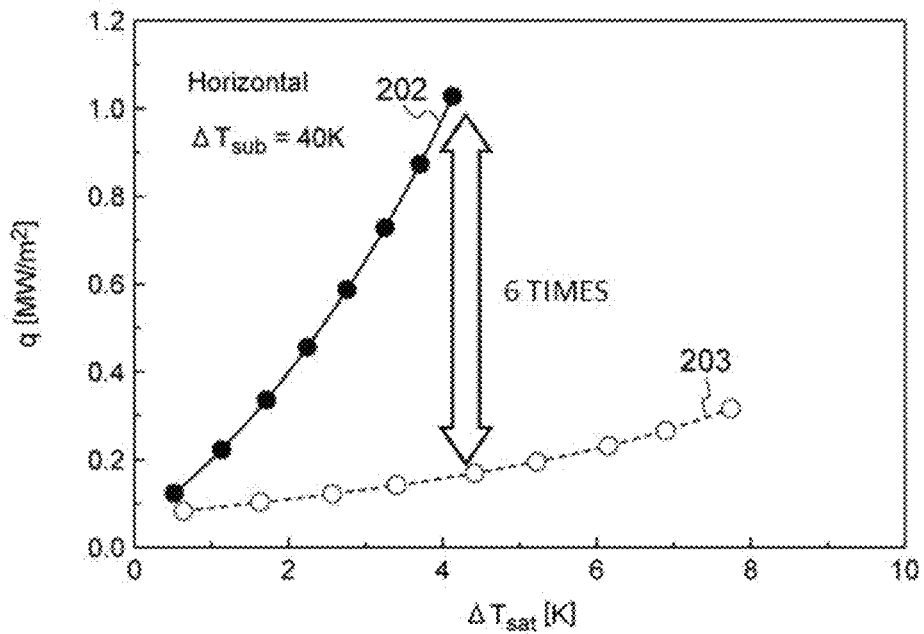
FIG. 36 is a graph showing the effect of the configuration of FIG. 35.

FIG. 36 is a graph showing an effect (improvement of cooling capacity) when the pyramidal projections 201 are provided on the radially inner surface 115a of the housing lower portion 112d. A curve 202 represents a case where the pyramidal projections 201 are provided, and a curve 203 represents a case where the pyramidal projection 201 is not provided. The vertical axis of the graph in FIG. 36 indicates the heat flow rate, and the horizontal axis indicates the degree of superheat of the heat transfer surface. As can be seen from this graph, a heat flow rate when the pyramidal projections 201 are provided on the radially inner surface 115a of the housing lower portion 112d is as six times high as a heat flow rate when the pyramidal projection 201 is not provided. That is, when the pyramidal projections 201 are provided, the amount of heat transferred in the cooling chamber 135 is remarkably increased.

In FIG. 34, the plurality of pyramidal projections 201 is provided without any front/rear/left/right clearances, but may be provided at predetermined intervals. Further, the shape of each of the pyramidal projections 201 is not limited to a quadrangular pyramid. For example, the shape of each of the pyramidal projections 201 may be a polygonal pyramid (for example, a triangular pyramid) other than a quadrangular pyramid, may be a cone, or may be an elliptical cone. For the values of the apex angle, pitch and height of the pyramidal projection 201 may be any value as long as the radially inner surface 115a can form more foaming points than the flat surface. For example, the apex angle θ1 may be 120 degrees.

In FIG. 34, as the foaming point formation promoting portion, an example is shown in which the pyramidal projections 201 are provided on the radially inner surface 115a of the housing lower portion 112d, but the foaming point formation promoting portion is not limited to the pyramidal projection 201. For example, a plurality of grooves may be provided on the radially inner surface 115a of the housing lower portion 112d. This is because when a groove is provided on the radially inner surface 115a, more foaming points can be generated, compared to the case where the radially inner surface 115a is flat. That is, it is only necessary to provide recesses, projections, or recesses/projections having an arbitrary shape on the radially inner surface 115a of the housing lower portion 112d. This is because such recesses/projections can generate more foaming points than the flat radially inner surface 115a.

FIG. 34 shows an example in which the foaming point formation promoting portion (pyramidal projections 201) is provided on the radially inner surface 115a of the housing lower portion 112d, but the position where the foaming point formation promoting portion is provided is not limited to the radially inner surface 115a of the housing lower portion 112d. For example, as shown in FIG. 37, the surface of the coil 118 may be provided with recesses/projections.

Figure 37:
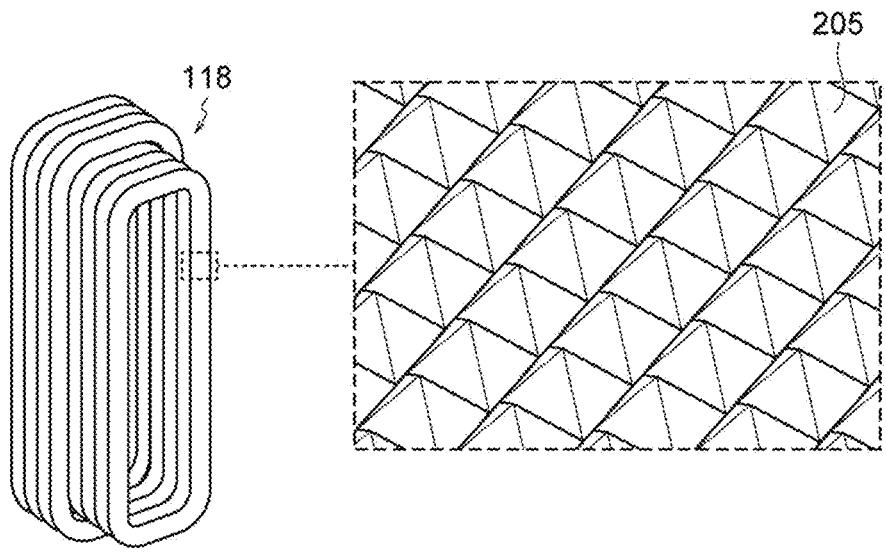
FIG. 37 is a diagram showing a configuration in which the pyramidal projection is provided on the surface of the coil.

In the example of FIG. 37, pyramidal projections 205 are provided on the surface of the coil 118. The pyramidal projection 205 is a projection similar to the pyramidal projection 201 in FIG. 34. In order to provide recesses/projections on the surface of the coil 118, for example, the coil 118 is subjected to sandblasting. When the coil 118 is wound around the tooth portion 114b and then sandblasting is performed, recesses/projections can be provided on the surface of the coil 118.

It should be noted that the surface of the coil 118 can be provided with recesses/projections by a method other than sandblasting. For example, by attaching a recess/projection blade for processing the coil coating at the nozzle tip of a winding machine of the coil 118, recesses/projections can be provided on the coil surface (coating) simultaneously at the time of the coil winding operation. Alternatively, after winding the coil 118, the surface of the coil 118 is etched with a chemical agent, so that recesses/projections can also be provided on the coil surface.

By sand blasting as described above, since the thickness of the coil coating (insulating coating) is small, the thickness of the insulating coating of the coil 118 is set in consideration of the sandblasting or the like.

Thus, the position where the foaming point formation promoting portion is provided may be any position as long as it is an area where many foaming points are generated. For example, a foaming point formation promoting portion such as a projection or a groove may be provided not only at the housing lower portion 112d (FIG. 33) and the coil (FIG. 37), but also at a site that defines the cooling chamber 135 (for example, the surface of the housing cylindrical shape portion 112f).

As shown in FIG. 20, the shaft 111 of the second embodiment has a simple columnar shape below a collar portion 111c. The configuration of the shaft 111 is not limited to the configuration shown in FIG. 20. For example, as shown in FIG. 38, the shaft 111 may have a fan 207 below the collar portion 111c.

Figure 38:
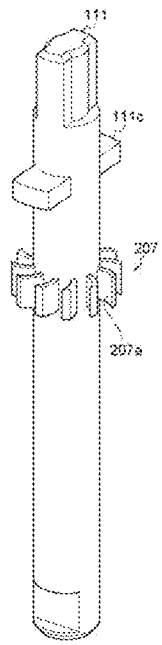
FIG. 38 is a perspective view showing a modification of the shaft.

As shown in FIG. 38, the fan 207 is a centrifugal fan having a plurality of blades 207a. The plurality of blades 207a is provided at predetermined intervals in the circumferential direction of the shaft 111. Each of the blades 207a is made of a curved plate member having a predetermined curvature. The fan 207 is provided so as to be positioned below the first bearing 123 shown in FIG. 14. That is, when the shaft 111 rotates, the fan 207 rotates in the duct 177 below the first bearing 123. The diameter of the fan 207 has, for example, a maximum value within a range in which it does not interfere with surrounding members.

In FIG. 27, air (outside air) A enters the motor 110 from the upper portion of the motor 110 (the rotor lid 113b), and its part (G2) flows downward along the shaft 111, but depending on the rotation direction of the rotor 113, air enters the motor 110 from the lower portion of the motor 110 and flows upward along the shaft 111 (the flow in the direction opposite to G3 and the flow in the direction opposite to G2 occurs). When such an air flow is generated by the fins 152 provided in the rotor lid 113b, the flow rate of the air flowing upward along the shaft 111 may be slow. This is likely to occur when the inner space 172 provided between the cylindrical shape portion 112f and the shaft 111 is narrow. This is because when the horizontal cross section of the inner space 172 is small, the ventilation resistance increases, and the flow rate of air is slow. When the airflow rate is slow, the cooling performance by air does not improve. Therefore, as shown in FIG. 38, the fan 207 is provided on the shaft 111, and the fan 207 rotates, so that the flow rate of the air flowing upward along the shaft 111 is increased. Since the rotor lid 113b is provided with fins 152, the amount of air flowing upward along the shaft 111 (wind volume) is increased by the fan 207 of the shaft 111 and the fins 152 of the rotor lid 113b. When the fins 152 of the rotor lid 113b are referred to as the first cooling fan, the fan 207 can be referred to as a second cooling fan.

When air flows downward along the shaft 111 as shown in FIG. 27, the fan 207 is provided at the lower portion of the shaft 111. Specifically, the fan 207 is provided so that the fan 207 is positioned above the second bearing 124. The fan 207 can increase the amount of outside air that flows downward along the shaft 111.

A motor according to the third embodiment of the present invention will be described with reference to FIGS. 39 to 48. The same components as those of the second embodiment are denoted by the same reference signs and detailed description thereof is omitted. The same cooling medium CM as that of the second embodiment is used.

Figure 39:
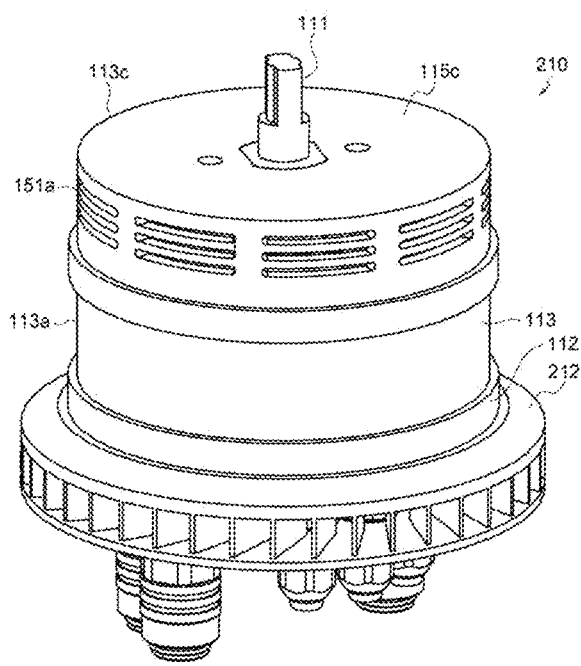
FIG. 39 is a perspective view of a motor according to a third embodiment.
Figure 40:
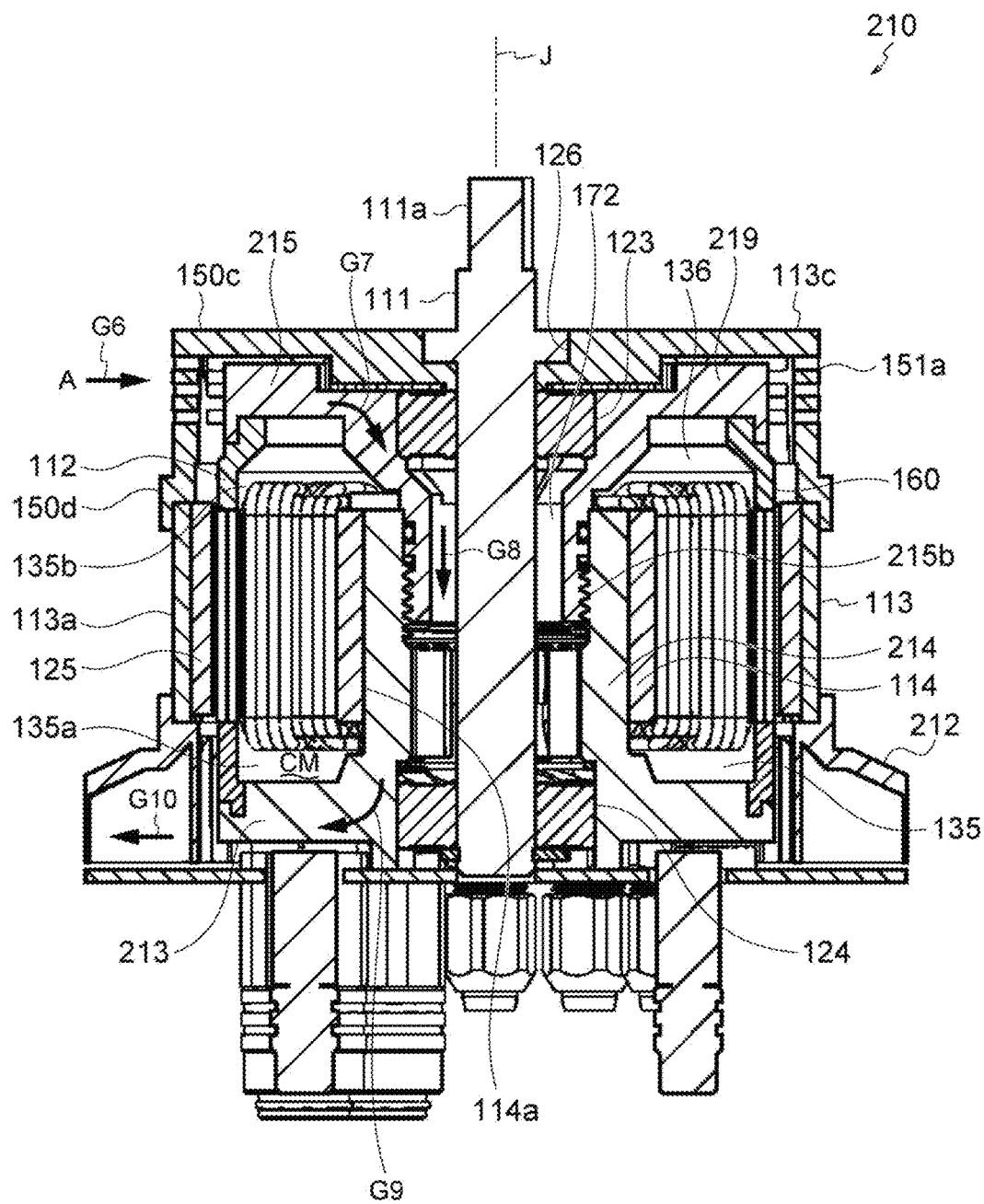
FIG. 40 is a vertical sectional view of the motor shown in FIG. 39.

FIG. 39 is a perspective view of a motor 210 according to the third embodiment, and FIG. 40 is a vertical sectional view. The difference from the second embodiment is that the first cooling fan (113b, 152) is provided on the upper portion of the motor in the second embodiment, but the first cooling fan is provided in the lower portion of the motor in the third embodiment. As shown in FIG. 39, the motor 210 has a cooling fan 212 as the first cooling fan at the lower portion of the motor.

As shown in FIGS. 39 and 40, the motor 210 includes the shaft 111, the substantially cylindrical housing member 112 having the same center axis as the shaft 111, and the rotor 113 located outside of the housing member 112. The rotor 113 includes the rotor tube portion 113a and a rotor lid 113c. The rotor 113 rotates radially outside of the housing member 112 with the center axis J of the shaft 111 as the rotation center. The housing member 112 supports the shaft 111. Since the rotor 113 rotates radially outside of the housing member 112, the motor 210 of this embodiment is also an outer rotor type motor. The direction in which the center axis J extends is referred to as the Z direction.

As shown in FIG. 40, the motor 210 includes the shaft 111 extending in the center axis J direction, the rotor 113 fixed to the shaft 111, the housing member 112 located radially inside the rotor 113, and the stator 114 disposed in the interior of the housing member 112. The stator 114 is located outside of the shaft 111 in the radial direction in the interior of the housing member 112. For example, when the motor 210 is used for a drone, the driving force of the motor 210 is transmitted to a blade (not shown) located on the upper side of the motor 210 via the output end 111a of the shaft 111.

Since the rotor 113 is fixed to the shaft 111, it rotates together with the shaft 111. The rotor 113 rotates radially outside of the housing member 112 with the center axis J of the shaft 111 as the rotation center. A predetermined clearance is provided between the rotor 113 and the housing member 112. The rotor tube portion 113a surrounds the housing outer portion. The rotor lid 113c covers the housing upper portion. The rotor magnet 125 is provided on the inner surface of the rotor tube portion 113a at a position radially facing the stator 114. The rotor magnets 125 are arranged at equal intervals in the circumferential direction.

The rotor lid 113c has a disk-like top portion 150c and a cylindrical portion 150d extending downward in the axial direction from the top portion. The cylindrical portion 150d has rotor openings 151a that open in a direction perpendicular to the center axis J. The rotor opening 151a of the present embodiment is an opening that penetrates the cylindrical portion 150d in the radial direction, and as shown in FIG. 39, a plurality of the rotor openings 151a is provided at predetermined intervals in the circumferential direction and the axial direction of the cylindrical portions 150d. The shaft 111 extends in the axial direction through the central opening 126 of the rotor lid 113c. The rotor lid 113c is fixed to the shaft 111. A housing lower portion 213 is integral with a cylindrical shape portion 214.

Figure 41:
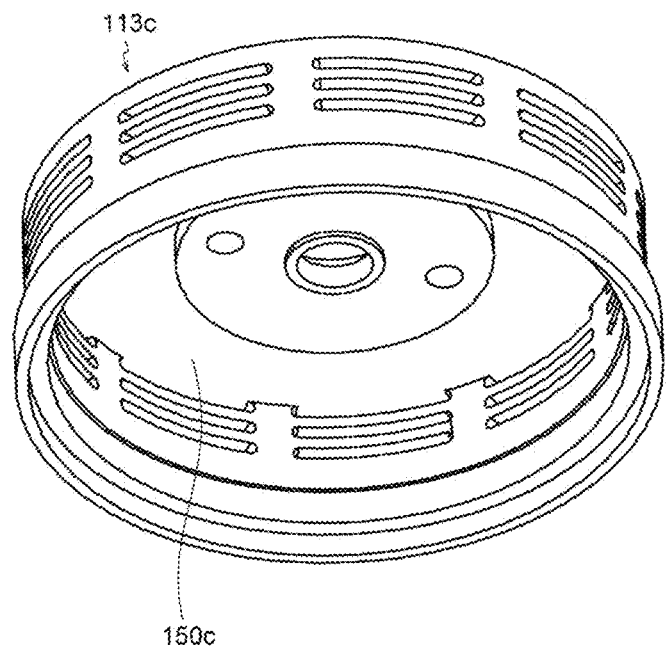
FIG. 41 is a perspective view of the rotor lid as viewed from below.

FIG. 41 is a perspective view of the rotor lid 113c as viewed from below. As shown in FIG. 41, no fin is provided on the inner surface of the top portion 150c of the rotor lid 113c.

The rotor tube portion 113a is a member similar to the rotor tube portion 113a of the second embodiment. Projections and rotor magnets 125 are alternately arranged on the inner face (inner peripheral face) of the rotor tube portion 113a.

Figure 42:
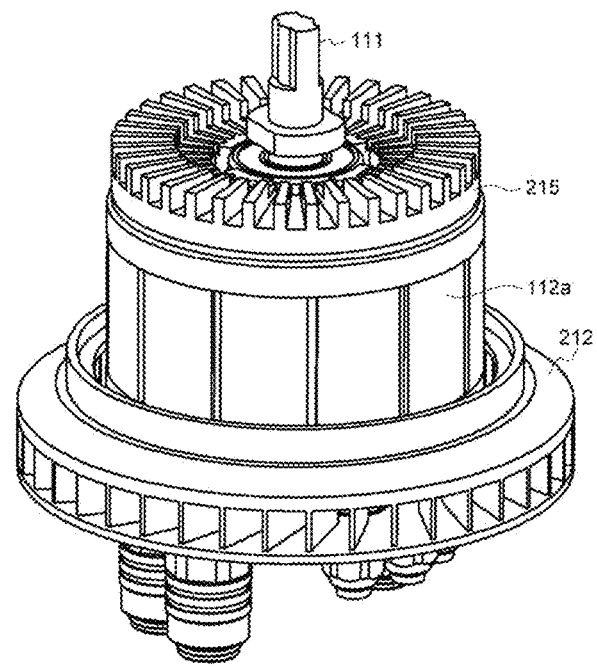
FIG. 42 is a diagram showing a state where the rotor lid and the rotor tube portion are removed from the state of FIG. 39.
Figure 43:
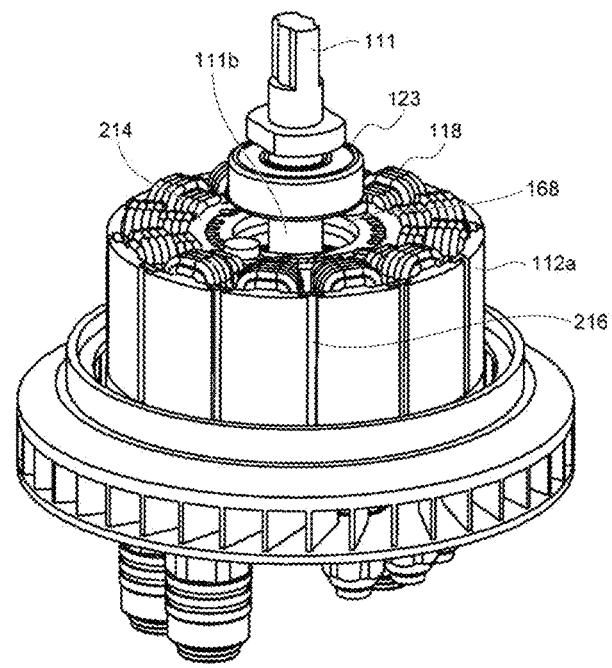
FIG. 43 is a diagram showing a state where the housing upper portion is removed from FIG. 42.
Figure 44:
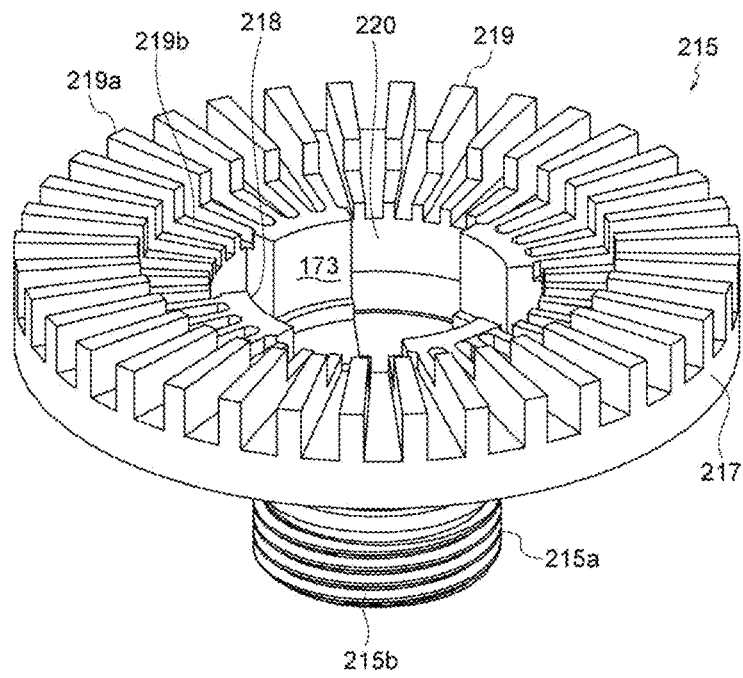
FIG. 44 is a diagram showing the housing upper portion.
Figure 45:
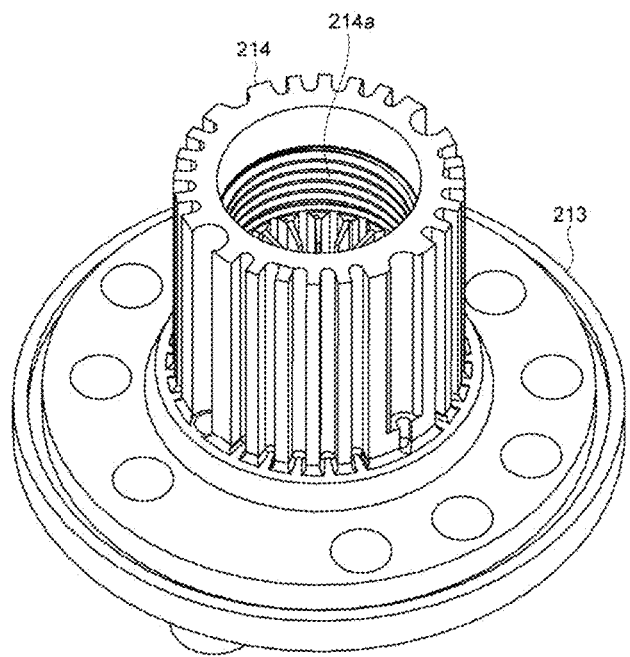
FIG. 45 is a diagram showing a housing lower portion and a cylindrical shape portion.

FIG. 42 shows a state where the rotor lid 113c and the rotor tube portion 113a are removed from the state of FIG. 39. FIG. 43 shows a state where a housing upper portion 215 is removed from FIG. 42. FIG. 44 shows the housing upper portion 215. FIG. 45 shows the housing lower portion 213 and the cylindrical shape portion 214. As shown in FIGS. 40 to 45, the housing member 112 includes a housing outer portion 112a, the housing upper portion 215 that supports the shaft 111 via a first bearing 123, a cylindrical shape portion 214 surrounding the shaft, and the housing lower portion 213. A female screw portion 214a is provided on the inner peripheral face of the cylindrical shape portion 214. The housing upper portion 215 has a cylindrical portion 215a extending downward. A male screw portion 215b is provided on the outer peripheral face of the lower end of the cylindrical portion 215a, and the male screw portion 215b is screwed into the female screw portion 214a of the cylindrical shape portion 214. The housing outer portion 112a includes the upper ring portion 160, the umbrella portion 161 (FIG. 22), and a seal member 216 which plugs a space between the umbrella portions 161. The stator 114 of the third embodiment has the same configuration as that shown in FIG. 22. In FIG. 43, the upper ring portion 160 is omitted.

As shown in FIGS. 40 to 45, the housing member 112 includes the cylindrical housing outer portion 112a centered on the center axis J, a cylindrically-shaped portion 214 having a smaller diameter than the housing outer portion 112a, the annular housing upper portion 215 connecting the housing outer portion 112a and the cylindrically-shaped portion 214 on the upper side, and the annular housing lower portion 213 that connects a housing outer portion 215 and the cylindrically-shaped portion 214 on the lower side. The housing lower portion 213 is located below the stator 114. The cylindrically-shaped portion 214 has a substantially cylindrical shape extending axially upward from the housing lower portion 213. In the present embodiment, the housing lower portion 213 and the cylindrically-shaped portion 214 are integrated. Since the upper portion of the cylindrically-shaped portion 214 is connected to the cylindrical portion 215a of the housing upper portion 215, in this embodiment, members similar to the cylindrical shape portion of the second embodiment are configured by the cylindrical portion 215a and the cylindrical shape portion 214 of the housing upper portion 215. The space defined by the housing outer portion 112a, the cylindrically-shaped portion 214, the housing upper portion 215, and the housing lower portion 213 is referred to as the hollow interior of the housing member.

Figure 46:
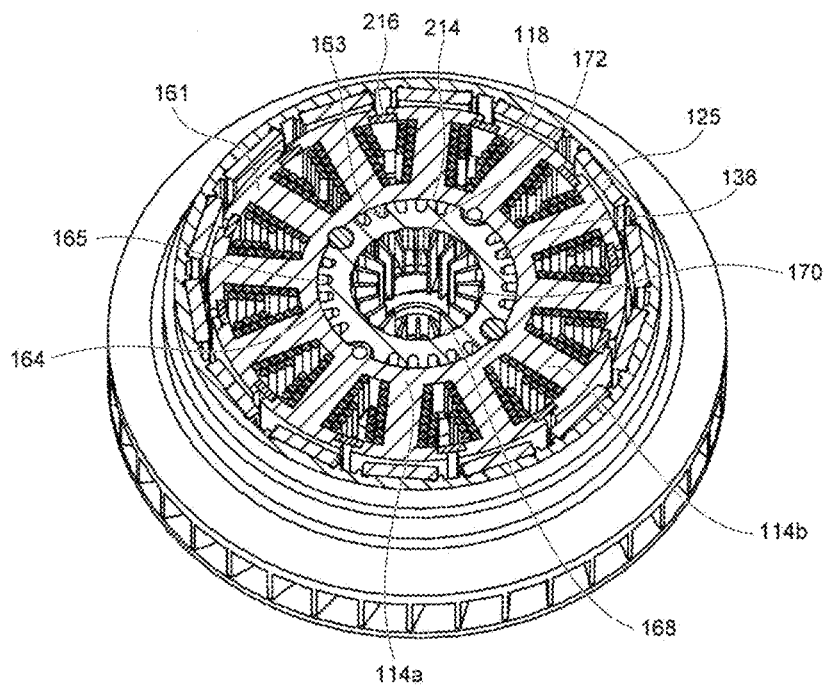
FIG. 46 is a horizontal sectional perspective view of the motor shown in FIG. 39.

The housing member 112 is made of, for example, metal or resin. In the case of metal, an insulating paint is applied to a predetermined portion of the inner surface of the housing member 112. The stator 114 is provided in the hollow interior of the housing member 112. The interior of the housing member 112 is filled with the cooling medium CM. The cooling medium CM is liquid at room temperature, and the coil 118 is immersed in the cooling medium CM in the interior of the housing member 112. Since the coil 118 generates heat while the motor 210 is driven, it may be referred to as a heating element in the following description. As shown in FIG. 46, the coil 118 is provided so as to contact the umbrella portion 161 that is the radially inner face of the housing outer portion 112a. According to this configuration, since the clearance between the coil 118 and the rotor magnet 125 can be further reduced, it is easy to improve torque performance.

As can be seen from FIG. 43, since the tooth portions 114b around each of which the coil 118 is wound are arranged at intervals in the circumferential direction, a clearance is formed between adjacent tooth portions 114b. This clearance is a cooling chamber 135 through which the cooling medium CM passes.

FIG. 46 is a sectional plan view of the motor 210. As shown in FIG. 46, the cylindrical shape portion 214 is located radially inside the central hole of the core back portion 114a. The cylindrical shape portion 214 has the cylindrical shape portion outer peripheral face 164 that contacts the core back inner peripheral face 163 of the core back portion 114a, and a plurality of the first outer peripheral recesses 165 that is recessed radially inward is provided on the cylindrical shape portion outer peripheral face 164. A space provided between the first outer peripheral recesses 165 and the core back inner peripheral face 163 constitutes the connection path 138 through which the cooling medium CM passes. The connection path 138 is a cooling medium passage having the same role as the second connection path 38 of the first embodiment.

As shown in FIG. 43, the cylindrical shape portion 214 surrounds the shaft 111. The cylindrical shape portion 214 has the cylindrical shape portion inner peripheral face 168 that is spaced apart by a predetermined distance from the shaft 111 in the radial direction and surrounds the shaft 111. As shown in FIG. 46, the heat radiation fins 170 protruding radially inward are provided on the cylindrical shape portion inner peripheral face 168. A plurality of the heat radiation fins 170 is provided at predetermined intervals in the circumferential direction. The inner space 172 located radially inside the cylindrical shape portion 214 is provided between the outer peripheral face 111b of the shaft 111 and the cylindrical shape portion inner peripheral face 168. The inner space 172 extends in the axial direction. The inner space 172 is an air passage through which outside air flows.

As shown in FIG. 44, the housing upper portion 215 includes a flat plate annular portion 217 having the central opening 173 that is an opening penetrating in the axial direction, a bearing holder portion 218 extending axially downward from the inner periphery of the central opening 173, and a heat sink 219 provided on the upper face of the flat plate annular portion 174. The flat plate annular portion 217 has a flat plate shape and a ring shape. In the present embodiment, a plurality of the heat sinks 219 extends radially outward from the central opening 173. Each heat sink 219 includes a heat sink outer portion 219a and a heat sink inner portion 219b. A step is formed by the heat sink outer portion 219a and the heat sink inner portion 219b. The heat sink outer portion 219a is higher than the heat sink inner portion 219b. The heat sink 219 makes it easy to release the heat in the interior of the housing member 112 to the outside.

The bearing holder portions 218 are provided at equal intervals in the circumferential direction, and a duct 220 is provided between adjacent bearing holder portions. The first bearing 123 is held by the bearing holder portion 218. The duct 220 is an opening provided between the first bearing 123 and the flat plate annular portion 217. Note that the second bearing 124 located below the first bearing 123 is, as shown in FIG. 40, supported by the housing lower portion 213. The shaft 111 is rotatably supported around the center axis J by the first bearing 123 and the second bearing 124.

Figure 47:
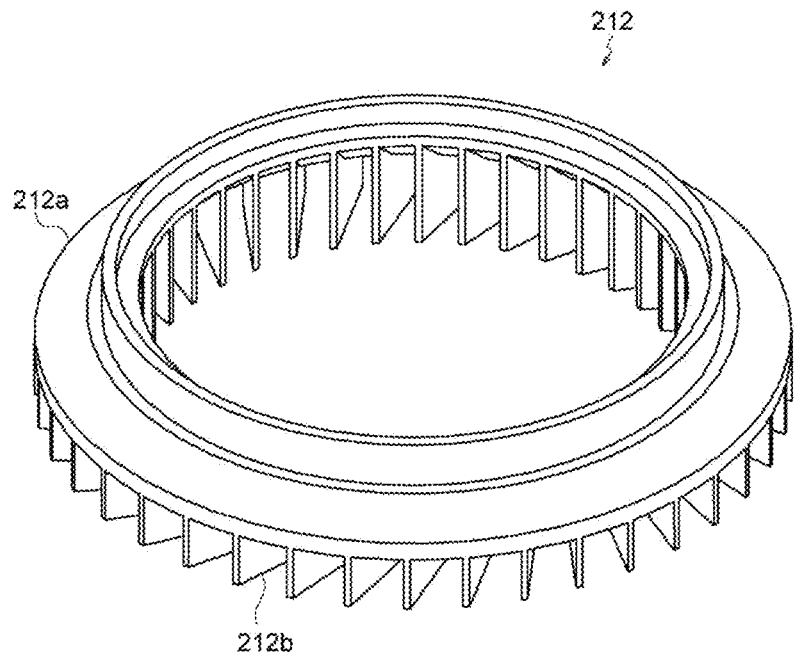
FIG. 47 is a perspective view of a cooling fan.

As shown in FIG. 40, the cooling fan 212 is provided around the housing lower portion 213. FIG. 47 is a perspective view of the cooling fan 212. As shown in FIG. 47, the cooling fan 212 includes an annular main body 212a and a plurality of fins 212b extending downward from the lower face of the main body 212a. The cooling fan 212 is a centrifugal fan. Each of the fins 212b is a substantially rectangular plate member. The plurality of fins 212b is provided at predetermined intervals in the circumferential direction. The cooling fan 212 is connected (joined) to the rotor 113, and when the rotor 113 rotates, the cooling fan 212 rotates about the shaft 111. When the rotor 113 rotates (when the cooling fan 212 rotates), the cooling fan 212 generates a negative pressure between the housing outer portion 112a and the cooling fan 212. Due to this negative pressure, air A flows into the motor 210 and flows through the housing. It can be said that the cooling fan 212 is a first cooling fan that generates an air flow for cooling the motor 210.

As shown in FIG. 40, when the rotor 113 rotates, the air A enters, as shown by the arrow G6, the inside of the rotor lid 113c from the rotor opening 151a of the rotor lid 113c. Thereafter, the air A passes through the duct 220 toward the direction of the shaft 111 as indicated by the arrow G7. Then, the air A reaches the shaft 111 and flows downward along the shaft 111 in the axial direction as indicated by an arrow G8. Thereafter, as indicated by an arrow G9, the air flows outward in the radial direction, passes through the cooling fan 212, and is discharged to the outside (arrow G10).

In this way, according to this embodiment, the air A can flow from the upper portion of the motor to the lower portion of the motor by installing the cooling fan 212 at the lower portion of the motor. First, the upper portion of the motor is cooled by the air flowing into the motor 210. Since the heat releasing chamber 136 is provided in the upper portion of the motor, in particular, the heat releasing chamber 136 can be efficiently cooled.

The stator 114 is located in the interior of the housing member 112, and in the interior of the housing member 112, the space other than the stator 114 is defined by the cooling chamber 135, the heat releasing chamber 136, and the connection path 138. The cooling chamber 135, the heat releasing chamber 136, and the connection path 138 are filled with the cooling medium CM.

The cooling chamber 135 is provided so as to accommodate the coil 118 from the lower side of the interior of the housing member. More specifically, the cooling chamber 135 includes a space above the housing lower portion 213, a space surrounding the lower end of the coil 118 from the upper end of the space, a space provided between the tooth portions 114b, and a space surrounding the upper end of the coil 118. The heat releasing chamber 136 is provided above the cooling chamber 135 in the interior of the housing member. The connection path 138 extends downward along the cylindrical shape portion 214 of the housing member 112 from the radially inner end portion of the heat releasing chamber 136, and connects the cooling chamber 135 and the heat releasing chamber 136. The lower side end portion of the connection path 138 in the vertical direction is connected to the inlet side end portion of the upper side of the cooling chamber 135 in the vertical direction.

The cooling chamber 135 cools the coil 118 that is a heating element. The cooling chamber 135 includes a first cooling chamber 135a that is a space below the stator 114, and the second cooling chamber 135b formed above the first cooling chamber 135a and surrounding the stator 114 and the coil 118. In the present embodiment, the coil 118 is located in the second cooling chamber 135b. The first cooling chamber 135a and the second cooling chamber 135b are continuous, and the cooling chamber 135 is constituted by the two cooling chambers. The coil 18 that is a heating element is accommodated in the cooling chamber 135.

A plurality of the tooth portions 114b of the stator 114 and the coil 118 are positioned in the second cooling chamber 135b. The cooling medium CM flows from the first cooling chamber 135a to the second cooling chamber 135b. When the cooling medium CM passes through the second cooling chamber 135b, it flows through the clearance between the plurality of tooth portions 114b of the stator 114 and the coil 118. In the present embodiment, since the cooling chamber 135 is connected to the heat releasing chamber 136, there is no first connection path of the first embodiment.

The heat releasing chamber 136 is formed under the housing upper portion 215. The heat releasing chamber 136 releases the heat of the cooling medium CM to the outside. The heat releasing chamber 136 is an annular space. The heat sink 219 is provided above the heat releasing chamber 136 in the vertical direction. The heat sink 219 is an example of a heat absorbing unit. The heat sink 219 absorbs heat from the cooling medium CM in the heat releasing chamber 136. The configuration of the heat absorbing unit is not limited to the heat sink as long as heat can be absorbed from the cooling medium CM in the heat releasing chamber 136. The heat sink 219 is made of a member having a relatively high thermal conductivity, for example. The cooling fan 212 provided at the lower portion of the rotor 113 generates a negative pressure at the lower portion of the rotor 113 when the rotor 113 rotates, so that air flow (G6 to G10) is generated by this negative pressure, and the interior of the housing member 112 is cooled (the air can be blown into the heat releasing chamber 136). Therefore, the cooling fan 212 promotes heat radiation from the heat releasing chamber 136.

The connection path 138 extends axially downward from the heat releasing chamber 136 along the cylindrical shape portion 214 to reach the cooling chamber 135.

The circulation of the cooling medium CM and the cooling of the heating element in the present embodiment is almost the same as those in the first embodiment except that there is no first connection path 37. The cooling medium CM heated by the coil 118 ascends in the cooling chamber 135 and reaches the heat releasing chamber 136. The cooling medium CM releases heat in the heat releasing chamber 136, moves downward through the connection path 138, and reaches the cooling chamber 135.

In this embodiment, since the cooling fan 212 for introducing (suctioning) the air A in the interior of the motor 210 is provided at the lower portion of the rotor 113, the air entering the interior of the motor 210 from the upper portion of the motor 210 flows into the air passage 172 through the duct 220 (G7, G8) and is discharged from the lower portion of the motor 210 (G9, G10). Because the air flow cools the interior of the motor 110, it is difficult for heat to stay in the interior of the motor 110. In particular, in this embodiment, since the air is first introduced into the upper portion of the motor, the upper portion of the motor (heat releasing chamber) can be efficiently cooled with air. When the heat releasing chamber 136 is appropriately cooled, so-called dry-out can be prevented or suppressed.

Figure 48:
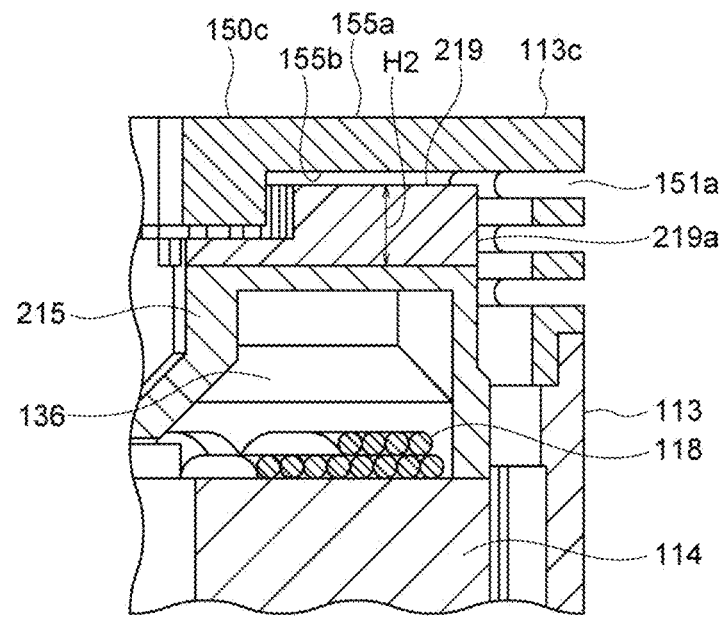
FIG. 48 is a partially enlarged view of FIG. 40.

FIG. 48 is a partially enlarged view of FIG. 40, and shows the rotor lid 113c, the heat sink 219, the housing upper portion 215, the coil 118, the stator 114, and the like. The rotor lid top portion 150c has an upper face 155a and a lower face 155b. In FIG. 48, a slight clearance is provided between the lower face 155b of the rotor lid top portion 150c and the upper face of the heat sink 219. Reference sign H2 indicates the height of the heat sink outer portion 219a. The height H2 of the heat sink outer portion 219a is determined according to the position of the lower face 155b of the rotor lid top portion 150c. The configuration of the heat sink 219 and the rotor lid 113c of the third embodiment is not limited to that shown in FIG. 48. For example, the configuration shown in FIG. 49 may be used.

Figure 49:
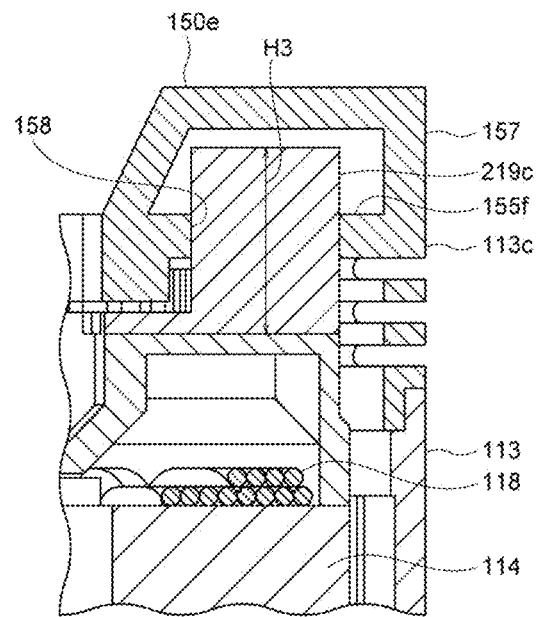
FIG. 49 is a diagram showing a modification of a heat sink.

In the modification shown in FIG. 49, the height of a heat sink outer portion 219c is higher than the height H2 of FIG. 48 as indicated by reference sign H3. As the height H3 of the heat sink outer portion 219c is increased, the shape of the rotor lid top portion 150e is also different from the shape of the rotor lid top portion 150c of FIG. 48. The heat sink outer portion 219c extends upward in the axial direction beyond the upper face 155a (face 155f in FIG. 49) of the rotor lid top portion 150c of FIG. 48. The shape of the rotor lid top portion 150e is a shape having a heat sink accommodation portion 157 on the rotor lid top portion 150c of FIG. 48. The heat sink accommodation portion 157 is an annular member having a substantially inverted U-shaped vertical cross section. An opening 158 through which the heat sink outer portion 219c passes is provided on the face 155f of the rotor lid top portion 150e. The heat sink accommodation portion 157 is integral with the rotor lid 113c. The shape of the heat sink outer portion 219c is a shape obtained by extending the heat sink outer portion 219a shown in FIG. 44 upward in the axial direction.

In the configuration shown in FIG. 49, since the opening 158 is provided on the face 155f of the rotor lid top portion 150e, and the heat sink accommodation portion 157 covering the opening 158 is provided, the height of the heat sink outer portion 219c can be increased according to the volume (height) of the heat sink accommodation portion 157. When the height of the heat sink outer portion 219c is increased, the surface area (cooling surface area) of the heat sink outer portion 219c is increased. As the cooling surface area is increased, the heat radiation capability of the heat sink 219 improves.

Figure 50:
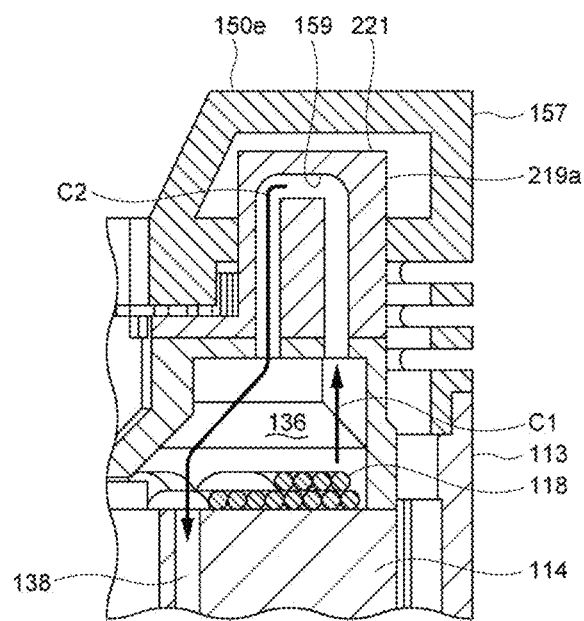
FIG. 50 is a diagram showing another modification of the heat sink.

FIG. 50 shows a modification of the configuration of FIG. 49. In the modification of FIG. 50, a passage 159 of the cooling medium is provided in the interior of the heat sink outer portion 219c having a height H3. The passage 159 is an inverted U-shaped passage provided in the axial direction from the upper portion of the heat releasing chamber 136. The passage 159 communicates with the heat releasing chamber 136.

When the height H3 of the heat sink outer portion 219c is increased, the heat radiation capability of the heat sink 219 is improved. When the height exceeds a certain level, the improvement in heat radiation capability will become gradual. Therefore, in the modification of FIG. 50, the passage 159 of the cooling medium is provided in the interior of the heat sink outer portion 219c, and the cooling medium was allowed to flow to an upper end 221 of the heat sink outer portion 219c. In this way, the heat of the cooling medium can be efficiently and directly transmitted to the entire heat sink outer portion 219c.

As shown by an arrow C1, the cooling medium heated by the heat generated by the coil 118 flows above the coil 118, enters a flow path 159 through the heat releasing chamber 136, and then reaches the upper portion of the heat sink outer portion 219c. Then, the cooling medium flows downward along the flow path 159 as shown by an arrow C2, and flows into the connection path 138 through the heat releasing chamber 136.

Since the cooling medium radiates heat in the flow path 159, it can be said that the flow path 159 is part of the heat releasing chamber 136. In this case, it can be said that the configuration of FIG. 50 is a configuration in which the heat releasing chamber 136 extends.

Figure 51:
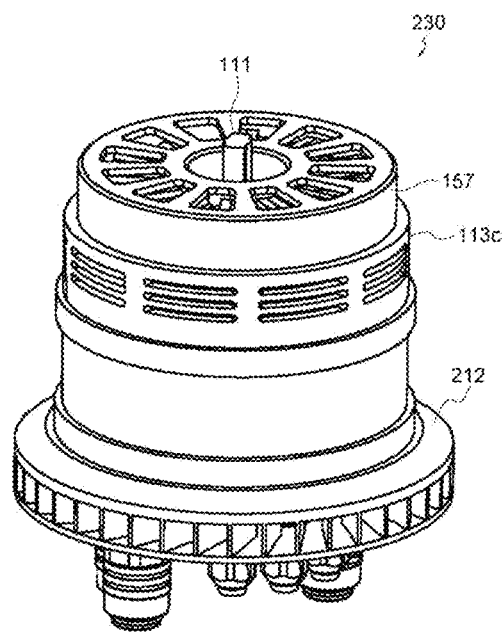
FIG. 51 is a perspective view of a motor including the heat sink of FIG. 50.

FIG. 51 is a perspective view of a motor 230 having the configuration of FIG. 50. As can be seen from the comparison with FIG. 39, in the motor 230 of FIG. 51 the heat sink accommodation portion 157 is provided on the rotor lid 113c.

Figure 52:
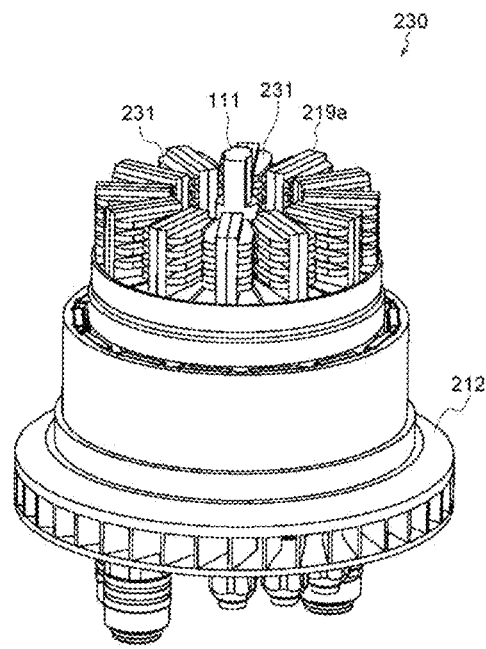
FIG. 52 is a diagram showing a state where the rotor lid is removed from the motor of FIG. 51.

FIG. 52 shows a state where the rotor lid 113c (with the heat sink accommodation portion 157) is removed from the motor 230 in FIG. 51. Each heat sink outer portion 219c has a plurality of heat radiation fins 231 extending in the horizontal direction. Each of the heat radiation fins 231 is a thin flat plate-like member. The heat radiation fins 231 provided on the heat sink outer portion 219c are cooled by ambient air. Therefore, the heat radiation fins 231 improve the heat radiation capability of the heat sink outer portion 219c.

Figure 53:
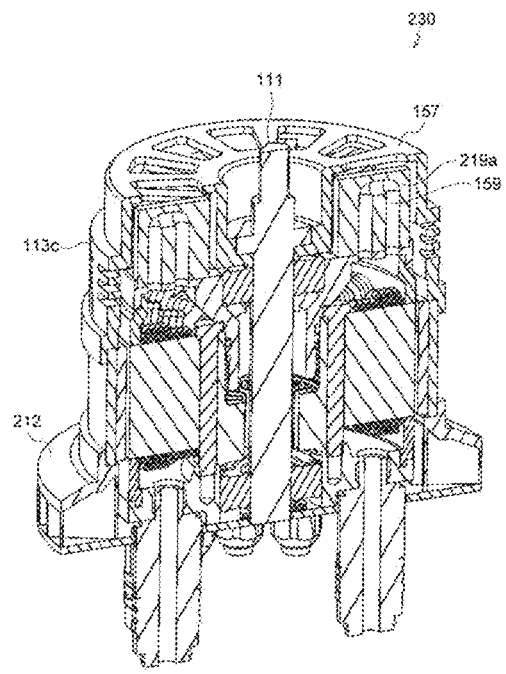
FIG. 53 is a vertical sectional view of the motor of FIG. 51.
Figure 54:
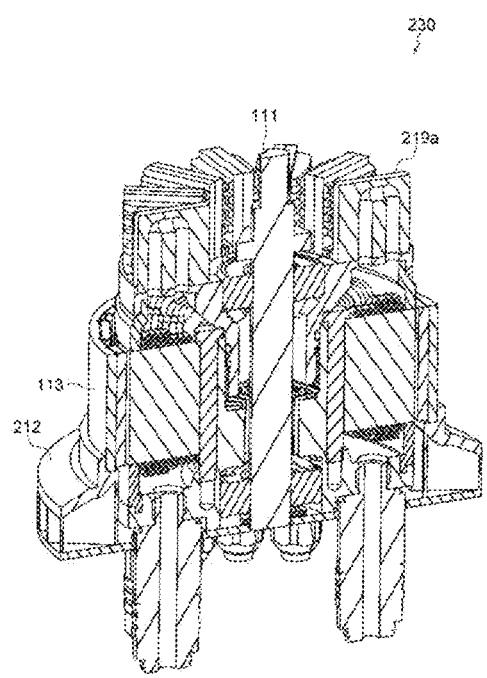
FIG. 54 is a vertical sectional view of the motor in the state of FIG. 52.

FIG. 53 is a vertical sectional view of the motor 230 of FIG. 51. FIG. 54 is a vertical sectional view of the motor 230 in the state shown in FIG. 52.

Figure 55:
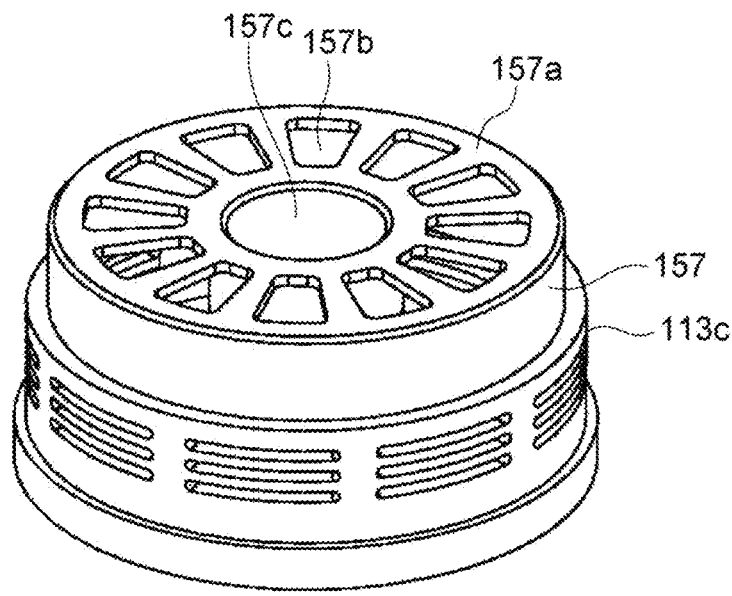
FIG. 55 is a perspective view of the rotor lid shown in FIG. 51.
Figure 56:
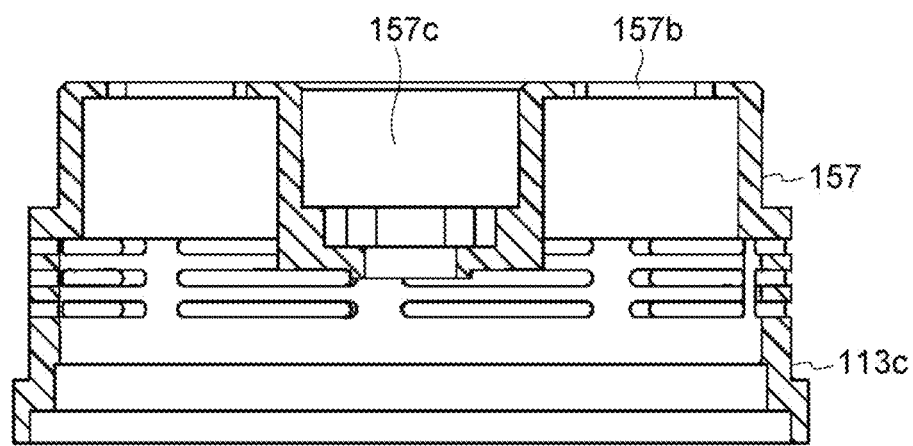
FIG. 56 is a vertical sectional view of the rotor lid shown in FIG. 55.

FIG. 55 is a perspective view of the rotor lid 113c (with the heat sink accommodation portion 157). The heat sink accommodation portion 157 has a plurality of upper face openings 157b on an upper face 157a. The upper face openings 157b are provided at a predetermined interval in the circumferential direction. The shape of each of the upper face openings 157b is a trapezoid when viewed from the axial direction. A central opening 157c is provided at the center of the upper face 157a. The shape of the central opening 157c is circular when viewed from the axial direction. Since air (outside air) enters the interior of the motor 230 from the upper face openings 157b, the air promotes heat radiation from the heat sink outer portion 219c, and the heat radiation capability of the heat sink outer portion 219c is improved. FIG. 56 is a vertical sectional view of the rotor lid 113c (with the heat sink accommodation portion 157) of FIG. 55.

The invention claimed is:

1. A motor, comprising:
    a shaft centered on a center axis extending in a predetermined direction;
    a stator located radially outside of the shaft,
    the stator having a coil wound around the stator;
    a housing member having a substantially cylindrical shape with a bottom, the housing member accommodating substantially the entire stator, the housing member supporting the shaft;
    a cooling medium with which the housing member is filled, the stator and the coil being immersed in the cooling medium; and
    a rotor that rotates radially outside of the housing member with the center axis of the shaft as a rotation center,
    wherein
    a heat releasing chamber in which the cooling medium radiates heat is located above the stator inside the housing member,
    a cooling chamber into which the cooling medium after radiating heat flows is located below the stator inside the housing member, and
    a first connection path through which the cooling medium flowing from the cooling chamber into the heat releasing chamber passes and a second connection path through which the cooling medium flowing from the heat releasing chamber into the cooling chamber passes are provided inside the housing member.

2. The motor according to claim 1, wherein the rotor is fixed to the shaft, and rotates radially outside of the housing member as the shaft rotates.

3. The motor according to claim 1, wherein
the housing member includes a housing outer peripheral portion that holds the stator and a housing upper portion that supports the shaft, and
the rotor includes a rotor tube portion surrounding the housing outer peripheral portion and a rotor lid that covers the housing upper portion, the rotor lid having an opening axially penetrating the rotor lid.

4. The motor according to claim 3, wherein the rotor has an impeller portion axially extending from the rotor lid.

5. The motor according to claim 3, wherein the rotor has an impeller portion extending radially inward from the rotor tube portion.

6. The motor according to claim 3, wherein a pressure adjustment element made of a resin material is provided at the housing upper portion.

7. The motor according to claim 1, wherein
the first connection path extends axially upward from the cooling chamber to the heat releasing chamber along an inside of a housing outer peripheral portion, and
the second connection path extends axially downward from the heat releasing chamber to the cooling chamber along the shaft at an outer periphery of the shaft.

8. The motor according to claim 1, wherein the second connection path axially penetrates the stator.

9. The motor according to claim 1, wherein
the stator is provided with a through hole axially penetrating the stator, and
the second connection path includes the through hole provided in the stator.

10. The motor according to claim 1, wherein the second connection path extends around the stator.

11. The motor according to claim 1, further comprising a first annular member located inside the housing member and on an axially upper side of the stator, the first annular member extending radially outward and axially upward,
wherein the first annular member is an annular shape.

12. The motor according to claim 1, wherein the cooling medium that has passed through the heat releasing chamber moves downward through the second connection path by a weight of the cooling medium to reach the cooling chamber.

13. The motor according to claim 1, wherein a drive circuit is provided inside the housing member, the drive circuit being immersed in the cooling medium.

14. The motor according to claim 1, wherein the rotor has a magnet at a position radially facing the stator.

15. The motor according to claim 1, wherein the coil wound around the stator contacts a radially inner surface of a housing outer peripheral portion.

16. The motor according to claim 1, wherein the cooling medium has insulation properties.

17. The motor according to claim 1, wherein
the housing member includes a housing outer peripheral portion surrounding the stator and a housing upper portion supporting the shaft, and
the housing outer peripheral portion includes a lower annular portion, a plurality of columnar portions extending axially upward from the lower annular portion and provided at predetermined intervals in a circumferential direction, and a plurality of plate-like members provided between the plurality of columnar portions.

18. The motor according to claim 17, wherein
the stator includes an annular core back portion and a plurality of tooth portions extending radially outward from the annular core back portion and around each of which the coil is wound, and
the plurality of plate-like members is in contact with respective distal end portion end faces of the plurality of tooth portions, and the plurality of columnar portions is located between the plurality of plate-like members.

19. The motor according to claim 17, wherein a face located on a radially outer side of each of the plurality of plate-like members has a diameter same as a diameter of a face located on a radially outer side of the lower annular portion.

20. The motor according to claim 17, wherein a face located on a radially outer side of each of the plurality of columnar portions has a diameter same as a diameter of a face located on a radially outer side of the lower annular portion.

21. The motor according to claim 17, wherein
each columnar portion among the plurality of columnar portions has a columnar engagement face having a diameter smaller than a diameter of a face located on a radially outer side of said each columnar portion, and
an inner peripheral portion of a corresponding plate-like member among the plurality of plate-like members has a plate-like engagement face that comes into contact with the columnar engagement face in a radial direction.

22. The motor according to claim 17, wherein
the housing member further includes a cylindrical shape portion surrounding the shaft,
the rotor includes a rotor tube portion surrounding a housing outer portion, a rotor lid that covers the housing upper portion, and a rotor opening penetrating from inside to outside of the rotor,
a duct extending toward the shaft is provided on the housing upper portion, and
the rotor opening communicates with the duct, and a space radially inside the cylindrical shape portion has an air passage communicating with the duct.

23. A motor, comprising:
a shaft centered on a center axis extending in a predetermined direction;
a stator located radially outside of the shaft,
the stator having a coil wound around the stator;
a housing member having a substantially cylindrical shape with a bottom, the housing member accommodating substantially the entire stator, the housing member supporting the shaft;
a cooling medium with which the housing member is filled, the stator and the coil being immersed in the cooling medium; and
a rotor that rotates radially outside of the housing member with the center axis of the shaft as a rotation center,
wherein
the housing member includes a cylindrical shape portion surrounding the shaft, a housing outer portion, of the stator, surrounding a portion around which the coil is wound, and a housing upper portion supporting the shaft,
the rotor includes a rotor tube portion surrounding the housing outer portion, a rotor lid that covers the housing upper portion, and a rotor opening penetrating from inside to outside of the rotor,
a duct extending toward the shaft is provided on the housing upper portion, and the rotor opening communicates with the duct, and a space radially inside the cylindrical shape portion has an air passage communicating with the duct.

24. The motor according to claim 23, wherein the rotor tube portion has a recess on an inner face of the rotor tube portion.

25. The motor according to claim 23, wherein
the stator includes an annular core back portion surrounding the cylindrical shape portion, a plurality of tooth portions which extends radially outward from the annular core back portion and around each of which the coil is wound, an umbrella portion circumferentially extending from a distal end of each of the plurality of tooth portions,
the housing member includes a seal member disposed between the adjacent umbrella portions, and
the umbrella portions and the seal member constitute the housing outer portion.

26. The motor according to claim 25, wherein the seal member is made of an elastic material.

27. The motor according to claim 23, wherein the space radially inside the cylindrical shape portion axially extends and is in contact with an outer periphery of the shaft.

28. The motor according to claim 23, wherein
the cylindrical shape portion has an inner peripheral face surrounding the shaft, the cylindrical shape portion being spaced by a predetermined distance in a radial direction from the shaft, and the space radially inside the cylindrical shape portion is provided between an outer peripheral face of the shaft and the inner peripheral face of the cylindrical shape portion, and
a projection protruding radially inward or a recess recessed radially outward is provided on the inner peripheral face of the cylindrical shape portion.

29. The motor according to claim 23, wherein a bearing that supports the shaft is held on the housing upper portion, and the duct opens radially outward from the bearing.

30. The motor according to claim 23, wherein an inner peripheral face of the stator is annular.

31. The motor according to claim 23, wherein
the motor includes a plurality of coils including the coil, and
a seal extension portion extends radially inward of a cutout portion of an umbrella portion, and the seal extension portion is located between adjacent coils of the plurality of coils.

32. The motor according to claim 23, further comprising a heat radiation assisting member provided in a heat releasing chamber, the heat radiation assisting member having one end in contact with the coil located in the heat releasing chamber, and another end in contact with the housing upper portion, the heat radiation assisting member having a predetermined thermal conductivity.

33. The motor according to claim 23, wherein
the housing member includes a housing lower portion located below the stator, and
a fan is provided at the housing lower portion, the fan generating an air flow that passes downward in a space radially inside the rotor opening, the duct, and the cylindrical shape portion.

34. The motor according to claim 23, further comprising a fan member that rotates together with the shaft, wherein the fan member is fixed to the shaft at a position rotating above or below the cylindrical shape portion.

* * * * *